US011923225B2

(12) United States Patent
Shiu et al.

(10) Patent No.: US 11,923,225 B2
(45) Date of Patent: Mar. 5, 2024

(54) PROCESSING ARRANGEMENT AND METHOD FOR ADJUSTING GAS FLOW

(71) Applicant: TAIWAN SEMICONDUCTOR MANUFACTURING COMPANY LIMITED, Hsin-Chu (TW)

(72) Inventors: Yi-Fam Shiu, Toufen (TW); Cheng-Lung Wu, Zhunan Township (TW); Yang-Ann Chu, Hsinchu (TW); Hsu-Shui Liu, Pingjhen (TW); Jiun-Rong Pai, Jhubei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 295 days.

(21) Appl. No.: 17/402,718

(22) Filed: Aug. 16, 2021

(65) Prior Publication Data

US 2022/0310429 A1 Sep. 29, 2022

Related U.S. Application Data

(60) Provisional application No. 63/164,617, filed on Mar. 23, 2021.

(51) Int. Cl.
*H01L 21/67* (2006.01)
*H01L 21/673* (2006.01)
*H01L 21/677* (2006.01)

(52) U.S. Cl.
CPC .. *H01L 21/67393* (2013.01); *H01L 21/67766* (2013.01); *H01L 21/67769* (2013.01); *H01L 21/67772* (2013.01); *H01L 21/67781* (2013.01)

(58) Field of Classification Search
CPC ......... H01L 21/67383; H01L 21/67766; H01L 21/67769; H01L 21/67772
See application file for complete search history.

(56) References Cited

U.S. PATENT DOCUMENTS

2002/0124906 A1* 9/2002 Suzuki .............. H01L 21/67366 141/98
2018/0130685 A1* 5/2018 Bonecutter ....... H01L 21/67772
2020/0073258 A1 3/2020 Chiu et al.
2021/0018853 A1 1/2021 Cheng

* cited by examiner

*Primary Examiner* — Kevin R Barss
(74) *Attorney, Agent, or Firm* — Cooper Legal Group, LLC

(57) ABSTRACT

A method includes initiating a gas flow of a first gas parallel to a wall of an interface module to create an air curtain across an opening defined in the wall. The method includes moving an interface door to reveal the opening, wherein the air curtain restrains a second gas within the interface module from passing through the opening. The method includes transferring a semiconductor wafer through the opening and moving the interface door to cover the opening. The method includes halting the gas flow of the first gas after moving the interface door to cover the opening.

20 Claims, 18 Drawing Sheets

PROCESSING ARRANGEMENT AND METHOD FOR ADJUSTING GAS FLOW

RELATED APPLICATIONS

This application claims priority to U.S. Provisional Application 63/164,617, titled AIR BARRIER DEVICE AND ITS OPERATION" and filed on Mar. 23, 2021, which is incorporated herein by reference.

BACKGROUND

Generally, material processing, such as wafer processing during semiconductor fabrication, utilizes one or more chambers. For example, a storage chamber stores wafers, a transfer chamber transfers wafers between chambers, and a process chamber is a chamber within which a wafer is processed. During semiconductor fabrication, a wafer often undergoes multiple fabrication processes in different process chambers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
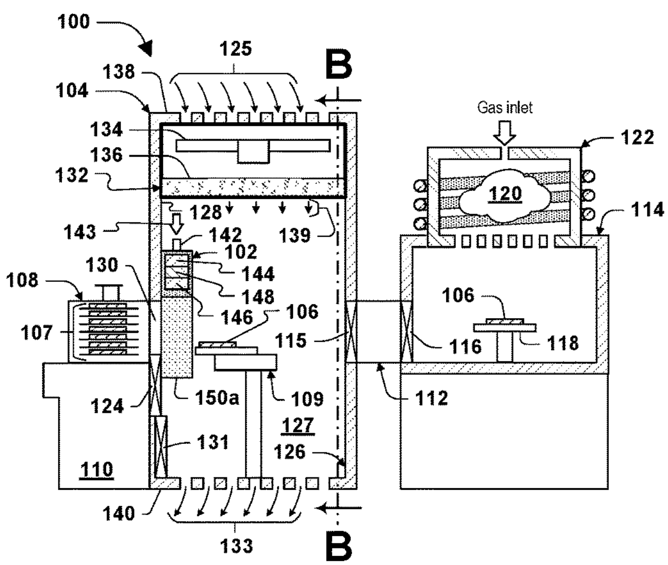
FIG. 1A is a side view and FIG. 1B is a front view of a processing arrangement, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

Semiconductor wafers are subjected to different processes (e.g., wet etching, dry etching, ashing, stripping, metal plating, and/or chemical mechanical polishing) in different processing chambers during the fabrication of semiconductor devices. The wafers are typically transported and temporarily stored in batches in wafer storage devices, also known as carriers, during intervals between the different processes. The wafers of each batch can be stacked vertically in the wafer storage devices and supported by support frames having multiple separate wafer shelves or slots within the wafer storage devices. These wafer storage devices, usually referred to as front-opening unified pods (FOUPs), may provide a humidity and contamination controlled environment to maintain the integrity of the wafers and/or the fabricated layers in and/or on the wafers. These wafer storage devices typically maintain an ultra clean environment.

Moisture from other processing modules, such as an interface module, may enter the wafer storage devices during docking and loading of the wafers between modules. An interface module, such as a facility interface or an equipment front end module (EFEM), may have a different level of moisture or contaminants than the wafer storage devices. The moisture may enter the wafer storage devices and react with residual materials on the wafers, such as from different wafer processes, and form defects in the fabricated layers on the wafers that can result in defective semiconductor devices, and hence, loss in production yield. For example, the wafers may be subjected to an etching process using tetrafluoromethane ($CF_4$) as the etchant and may have cryptohalite ($(NH_4)_2SiF_6$) as the residual material. Cryptohalite can react with moisture in the form of water vapor to produce ammonia ($NH_3$) and hydrofluoric acid (HF), which can remove portions of the fabricated layer materials from the wafers and form defects in the fabricated layers. In another example, moisture and/or oxygen can induce oxidation or a loss of Cu on wafers stored within the wafer storage devices.

Wafers may be subjected to additional processes and/or techniques to reduce dimensions, increase yield, etc. For example, the wafers may be subjected to a water wash between fabrication operations, which may provide residual moisture on the wafers or an environment surrounding the wafers. The residual moisture in the form of water vapor may be transferred to an environment of an interface module and may subsequently enter connected wafer storage devices. Multiple wafer storage devices, corresponding to wafers at different stages of processing, may be connected to the interface module and provide a source for moisture transfer.

Besides moisture, contaminants in the form of particulates and/or chemical gases from an interface module can enter the wafer storage devices and can also result in defective wafers and hence, defective semiconductor devices. These contaminants, which can be from chemicals outgassed from fabricated layer materials, may adhere to interior surfaces of the interface module and subsequently, transfer back to the wafers in subsequent process operations as the wafers are removed and returned to the wafer storage devices.

The present disclosure provides example processing arrangements and methods that are configured to inhibit and/or reduce moisture and/or contaminants present in an interface module from entering the wafer storage devices or other connected modules. In some embodiments, an example processing arrangement for a wafer includes a flow adjusting unit above an opening defined in a wall. The flow adjusting unit may include one or more gas nozzles and a first layer a first distance below the gas nozzle. The first layer may define a first aperture having a first aperture size. A second layer may be provided a second distance below the one or more gas nozzles and define a second aperture having a second aperture size greater the first aperture size. The one or more gas nozzles may provide a gas flow to the first layer and the first layer may disperse the gas flow directed to the second layer. The second layer may then channel the gas flow in a direction parallel to the wall across the opening defined in the wall.

The example processing arrangements and methods disclosed herein inhibit and/or reduce moisture and/or contaminants present in an interface module from entering one or more connected wafer storage devices, and also provide an air barrier to maintain separation of environments between the interface module and the one or more wafer storage devices. As a result, these example processing arrangements and methods increase the throughput of processed wafers with improved environments of the wafer storage devices and increased production yield due to a decrease in defective wafers. In some embodiments, a vertical air curtain is provided across an opening defined in a wall of a transfer chamber to maintain the separation of environments.

Figure 1B:
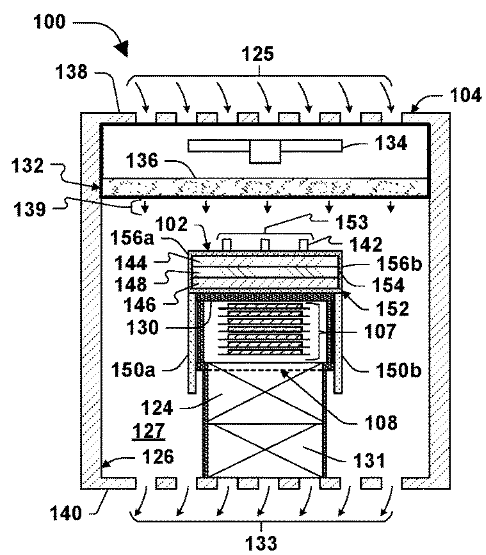

FIG. 1A is a schematic illustration of a processing arrangement 100, according to some embodiments. FIG. 1B is a schematic illustration of the processing arrangement 100 taken along line B-B of FIG. 1A, according to some embodiments. In some embodiments, the processing arrangement 100 includes a flow adjusting unit 102 within a module, such as an interface module 104, for processing a wafer 106. In some embodiments, the processing arrangement 100 includes one or more processing apparatuses and/or modules, such as a wafer storage device 108, a load port 110, a load lock module 112, and a processing module 114. The number of processing apparatuses and/or modules can be varied according to different manufacturing procedures associated with semiconductor wafer processing. In some embodiments, the processing arrangement 100 may be provided in a large space clean room that provides a clean room environment with lower particle concentration and lower degree of relative humidity than an ambient environment.

According to some embodiments, the processing arrangement 100 is configured to perform manufacturing procedures involved in the processing of one or more wafers, such as the wafer 106 or a plurality of wafers 107. In some embodiments, the interface module 104 includes an operating machine 109, such as a robotic arm, a track based extension member, or other mechanical device. The operating machine 109 is configured to transfer the wafer 106 between the wafer storage device 108 and the interface module for processing. The wafer 106, processed by the processing arrangement 100, may include a number of layers, such as a semiconductor layer, a conductor layer, and/or insulator layers. In some embodiments, the wafer 106 may include one or more semiconductor, conductor, and/or insulator layers. The semiconductor layers may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or gradient such as a substrate in which the ratio of Si and Ge vary across locations. In some embodiments, the wafer 106 may include layered semiconductors. Examples include layering of a semiconductor layer on an insulator such as that used to produce a silicon-on-insulator ("SOI") substrate, a silicon-on-sapphire substrate, a silicon-germanium-on-insulator substrate, or the layering of a semiconductor on glass to produce a thin film transistor ("TFT"). The wafer 106 may go through many processing operations, such as lithography, etching, and/or doping before a completed die is formed.

In some embodiments, the processing arrangement 100 includes a processing module 114, which may be one of a number of processing modules that may be configured to perform any manufacturing procedure on the wafer 106. Wafer manufacturing procedures include: deposition such as physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) and/or other deposition processes; etching (e.g., wet etching, dry etching, plasma etching, reactive-ion etching (RIE), atomic layer etching (ALE), buffered oxide etching, ion beam milling, etc.); lithographic exposure (e.g., photolithography); ion implantation (e.g., embedding dopants in regions of a material); surface passivation; thermal treatments (e.g., rapid thermal anneal, furnace anneals, thermal oxidation, etc.); cleaning such as wet clean processing (e.g., cleaning by solvents such as acetone, trichloroethylene, ultrapure water, etc.), rinsing, and/or plasma ashing; chemical mechanical polishing or chemical mechanical planarizing (CMP); testing; any procedure involved in wafer processing; and/or any combination of procedures. According to an example, the processing module 114 is shown as an example CVD module that receives the wafer 106 from the load lock module 112 through a chamber door 116 for placement and processing on a stage 118. Source reactive materials and a carrier gas 120 may be received from an ancillary processing chamber 122 for processing the wafer 106.

The load lock module 112 is arranged between the processing module 114 and the interface module 104. The load lock module 112 is configured to preserve the environment within the processing module 114 through separation from the interface module 104. In some embodiments, the load lock module 112 receives the wafer 106 through an interface door 115 of the interface module 104 or the chamber door 116 of the processing module 114. When the wafer 106 is inserted into the load lock module 112, the load lock module 112 is sealed. The load lock module 112 is configured to create a load lock environment compatible with the processing module 114 and/or the interface module 104 depending on processing operations of associated with the wafer 106. The load lock environment can be controlled by altering gas content within the load lock module 112, such as by adding gas, exhausting gas, creating a vacuum, and/or other procedures for adjusting the load lock environment. The load lock module 112 may include one or more pumps (not shown) for exhausting gases, such as corrosive gases, from within an interior chamber of the load lock module 112. The one or more pumps of the load lock module 112 may be a centrifugal pump, an air cooled pump (ACP), a roots vacuum pump (RUVAC), or another type of pump, to eliminate corrosive gases, supply inert gases, and/or create a vacuum within the load lock environment. When a suitable environment has been achieved within the load lock module 112, the wafer 106 may be transferred to the interface module 104 or the processing module 114. In some embodiments another processing module, such as a cluster tool module, or one or more other tools, tool components, tool interfaces, adjacent tools, or neighboring tools, may be provided between the load lock module 112 and the interface module 104.

In some embodiments, the processing arrangement 100 includes the load port 110 adjacent to the interface module 104. The load port 110 is configured to receive the wafer storage device 108. In some embodiments, an overhead hoist transport (OHT) (not shown) transports the wafer storage device 108 from another module, such as a stocker (not shown), to the load port 110. In some embodiments, the load port 110 may be connected to a remote load lock (RLL) module (not shown) to receive one or more wafers. For example, a mechanical device may be used to transfer a wafer from between the load port 110 and the remote load lock (RLL) module. In some embodiments, the load port 110 provides an ultra clean environment to the wafer storage device 108. The ultra clean environment can be controlled by altering gas content within the wafer storage device 108, such as by adding gas, exhausting gas, creating a vacuum, and/or other procedures for adjusting and/or maintaining the ultra clean environment. In an example, exhausting gas from within the wafer storage device 108 may be performed, such as to create vacuum conditions, near vacuum conditions (e.g., less than $10^{-4}$ torr), or relative vacuum conditions (e.g., less than $10^{-2}$ torr). In an example, exhausting gas may be performed before, after, and/or during adding gas to the wafer storage device 108. In an example, the added gas may be $N_2$, Ar, clean dry air (CDA), another type of inert gas, or another type of added gas. In an example the CDA may have: $H_2O$<1 parts per billion (ppb); $H_2O$, $CO_2$<1 milligram (mg) of solute in 1000 mg of solution (ppt) with acids, organics, and other compounds <1 ppt and bases <5 ppt; $H_2O$, CO, $CO_2$, non-methane hydrocarbons (NMHCs)<1 ppb; or other purity levels.

In some embodiments, the wafer storage device 108 is arranged on top of the load port 110 and adjacent to the interface module 104. For example, the wafer storage device 108 may be locked onto a top surface of the load port 110. In some embodiments, the wafer storage device 108 is configured as a standard mechanical interface (SMIF) or a FOUP to retain the plurality of wafers 107. The wafer storage device includes a storage device door 124 that opens to provide transfer of a wafer of the plurality of wafers 107 to the interface module 104. The plurality of wafers 107 may configured for batch processing, such as stacked vertically in the wafer storage device 108. In an example, the wafer storage device 108 may include a plurality of support frames having multiple separate wafer shelves or slots therein to retain the plurality of wafers 107. In an example, the wafer storage device 108 may include a removable cassette to retain the plurality of wafers 107. In some embodiments, the wafer storage device 108 is configured to provide an ultra clean environment, such as a humidity- and a contamination-controlled environment, to maintain the integrity of the plurality of wafers 107.

In some embodiments, the load port 110 communicates gas with the wafer storage device 108 to provide the ultra clean environment within the wafer storage device 108. The gas may be added to the wafer storage device 108 by the load port 110 through a gas inlet and gas may be exhausted from the wafer storage device 108 through a gas outlet. In an example, the wafer storage device 108 includes a diffuser or other ventilation plate(s) within an interior chamber of the wafer storage device to transmit the input gas at different locations within the wafer storage device 108. In an example, the wafer storage device 108 includes a panel-purge diffuser, such as an ultra-high molecular weight polyethylene (UPE) board, to communicate and diffuse the input gas at different locations within the wafer storage device 108. In some embodiments, the load port 110 communicates gas with the wafer storage device 108 to provide a humidity level within the wafer storage device 108 less than 10% relative humidity (RH). In some embodiments, the humidity level within the wafer storage device 108 is less than 5% RH, or less than 1% RH. In some embodiments, the humidity level within the wafer storage device 108 is substantially undetectable. The ultra clean environment within the wafer storage device 108 may be subject to contamination and/or introduction of humidity, such as when the storage device door 124 opens to provide transfer of one or more wafers of the plurality of wafers 107 to the interface module 104.

In some embodiments, the interface module 104 is disposed adjacent to the load port 110, the wafer storage device 108, and the load lock module 112. In some embodiments, the interface module 104 is configured as a facility interface, an EFEM, or other type of interface for transferring the wafer 106 from the wafer storage device 108 to another module and/or device, such as the load lock module 112 or another wafer storage device. The interface module 104 may be disposed within a clean room (not shown), which itself provides a level of cleanliness and/or humidity. The interface module may be configured to provide a mini environment with a higher level of cleanliness and/or lower level of humidity than the clean room. For example, the temperature within the mini environment may be maintained at a consistent temperature, such as between 20° C. and 25° C. (e.g., 22° C.), and a consistent humidity level, such as between 20% RH and 45% RH, between 25% RH and 35% RH, or about 30% RH. The humidity level of the mini environment may change during a processing cycle of the plurality of wafers 107. In some embodiments, the interface module 104 includes a transfer chamber 126 defining a transfer space 127. The transfer chamber 126 of the interface module 104 may receive gas 125 from the clean room environment through a top portion 138 of the interface module 104 and transmit the gas 125 using a fan filter unit 132 to create a gas flow 139 within the transfer chamber 126. In an example, the fan filter unit 132 may operate for a period of time before introduction of the plurality of wafers 107, such as 15 minutes or greater, and the humidity level of the transfer chamber 126 may stabilize at about 25% RH. However, when a batch of the plurality of wafers 107 has received a recent wash cycle and has been subsequently transferred to the transfer chamber 126, residual moisture may cause fluctuations of the humidity level within the transfer chamber 126, such as increasing the humidity level above 35% RH. During repeated cycling and processing of the plurality of wafers 107, moisture within the transfer chamber 126 may build and/or fluctuate faster than an ability of the fan filter unit 132 to normalize environmental conditions. In some embodiments, the mini environment within the transfer chamber 126 of the interface module 104 is configured to provide a level of environmental separation of the plurality of wafers 107 from sources of contamination and/or cross-contamination, such as contamination from human operators.

In some embodiments, the interface module 104 includes a transfer chamber 126 with a wall 128 adjacent to the load port 110 and the wafer storage device 108. The wall 128 defines an opening 130, which may be sealed through operation of an interface door 131. The interface door 131 may be opened to permit the operating machine 109 to transfer the wafer 106 through the opening 130 for processing. In some embodiments, the interface module 104 includes the fan filter unit 132 to create and/or maintain the mini environment within the transfer chamber 126 of the interface module 104. The fan filter unit 132 includes a fan unit 134 and a filter unit 136. The fan unit 134 draws air through a top portion 138 of the interface module 104, which is then filtered by the filter unit 136 then input into the transfer chamber 126 of the interface module 104. Air from within the transfer chamber 126 is then exhausted through a bottom portion 140 of the interface module 104. In some embodiments, an exhaust pump (not shown) is configured to exhaust air from the transfer chamber 126 through the bottom portion 140 of the interface module 104. In some embodiments, a plurality of fan filter units are configured to draw air through the top portion 138 of the interface module 104 and a plurality of exhaust pumps are configured to exhaust air through the bottom portion 140 of the interface module 104. The fan filter unit 132 and the exhaust pump of the interface module 104 cooperate to communicate air within the transfer chamber 126 as the gas flow 139 in a downward direction.

In some embodiments, the interface module 104 includes the flow adjusting unit 102 above the opening 130 defined in the wall 128 of the interface module 104. In some embodiments, the flow adjusting unit 102 includes a gas nozzle 142 to communicate a gas 143 to the flow adjusting unit 102. In some embodiments, the gas 143 is at least one of $N_2$, Ar, clean dry air (CDA), another type of inert gas, or another type of added gas. In an example the CDA may have: $H_2O<1$ parts per billion (ppb); $H_2O$, $CO_2<1$ milligram (mg) of solute in 1000 mg of solution (ppt) with acids, organics, and other compounds <1 ppt and bases <5 ppt; $H_2O$, CO, $CO_2$, NMHCs<1 ppb; or other purity levels.

In some embodiments, the flow adjusting unit 102 includes one or more gas nozzles, such as the gas nozzle 142, and one or more layers, such as a first layer 144, a second layer 146, and/or a third layer 148. In some embodiments, the first layer 144 is provided a first distance below the gas nozzle 142, and a second layer 146 provided a second distance greater than the first distance below the gas nozzle 142. As set forth in greater detail below, the first layer 144 defines a first aperture having a first aperture size and the second layer 146 defines a second aperture having a second aperture size greater the first aperture size. The gas nozzle 142 receives the gas 143 and provides a gas flow to the first layer 144. The first layer 144 disperses the gas flow directed to the second layer 146. The second layer 146 then channels the gas flow in a direction parallel to the wall 128 directed across the opening 130. In some embodiments, the gas flow creates a vertical air curtain directed across the opening 130. In some embodiments, the third layer 148 is provided a third distance greater than the first distance but less than the second distance below the gas nozzle 142. The third layer 148 defines a third aperture having a third aperture size less than the first aperture size of the first aperture in the first layer. In some embodiments, an extension plate **150*a* is provided below the second layer 146 to constrain the gas flow across the opening 130. In some embodiments, a pair of extension plates 150*a*, 150*b* are provided below the second layer 146 to constrain the gas flow across the opening 130**.

In some embodiments, the gas nozzle 142 is made of metal materials (such as aluminum, stainless steel, etc.), dielectric materials (such as quartz, alumina, silicon nitride, etc.), a polymer material, a ceramic material, other suitable materials and/or combinations thereof. Examples of suitable polymers include fluoropolymers, polyetherimide, polycarbonate, polyetheretherketone (PEEK), polytetrafluoroethylene (PTFE), polyoxymethylene (POM), polyimide, and/or other suitable polymers. Examples of ceramic material include alumina, ceria, yttria, zirconia, and/or other suitable ceramic materials. Examples of quartz materials include fused quartz, fused silica, quartz glass, and/or other suitable quartz materials.

As illustrated in FIG. 1B, the processing arrangement 100 is shown with a front view taken along line B-B of FIG. 1A, according to some embodiments. The processing arrangement 100 is illustrated with the interface door 131 of the interface module 104 in the open position and the storage device door 124 of the wafer storage device 108 in the open position. With the storage device door 124 and the interface door 131 open, the operating machine 109 may transfer one or more of the plurality of wafers 107 between the wafer storage device 108 and the transfer chamber 126 of the interface module 104. In some embodiments, the flow adjusting unit 102 includes a housing 152 defining a flow adjusting chamber 154. In some embodiments, the housing 152 supports a plurality of gas nozzles 153, including the gas nozzle 142, above the flow adjusting chamber 154 to provide the gas flow to the first layer 144. In some embodiments, the extension plate **150*a* is connected to a lateral side 156*a* of the housing 152 to constrain the gas flow across the opening 130. In some embodiments, an extension plate 150*b* is connected to a lateral side 156*b* of the housing 152 to constrain the gas flow across the opening 130. In some embodiments, the extension plates 150*a,b* are configured as a baffle to block a flow of ambient air from within the transfer chamber 126 from entering the wafer storage device 108 when the storage device door 124 is in the open position. In an example, when the storage device door 124 is opened, a difference between the ultra clean environment within the wafer storage device 108 and the mini environment within the transfer chamber 126 may cause turbulent airflow about the opening 130, which is reduced by the extension plates 150*a,b*. In an example, the gas flow 139 within the transfer chamber 126 created by the fan filter unit 132 may interact with the wall 128, other sidewalls of the transfer chamber 126, the operating machine 109, other components within the transfer chamber 126, and/or the gas flow 139 itself to cause turbulent gas flow about the opening 130. In some embodiments, such turbulent gas flow about the opening 130 is reduced by the extension plates 150***a,b*. In some embodiments, the extension plates 150*a,b* and the housing 152 of the flow adjusting unit 102 cooperate to form a canopy to reduce turbulent gas flow from about the opening 130. In some embodiments, the canopy formed by the housing 152 and the extension plates 150*a,b* cooperate with the vertical air curtain output from the second layer 146 across the opening 130 to maintain the separation of environments between the interior chamber of the wafer storage device 108 and the transfer chamber 126. In some embodiments, the vertical air curtain may block the gas flow 139 from entering the wafer storage device 108, and thereby may reduce introduction of humidity and/or contaminants within the ultra clean environment of the wafer storage device 108. Other arrangements and/or configurations of the processing arrangement 100, including the interface module 104 and the flow adjusting unit 102 are within the scope of the present disclosure.

Figure 2:
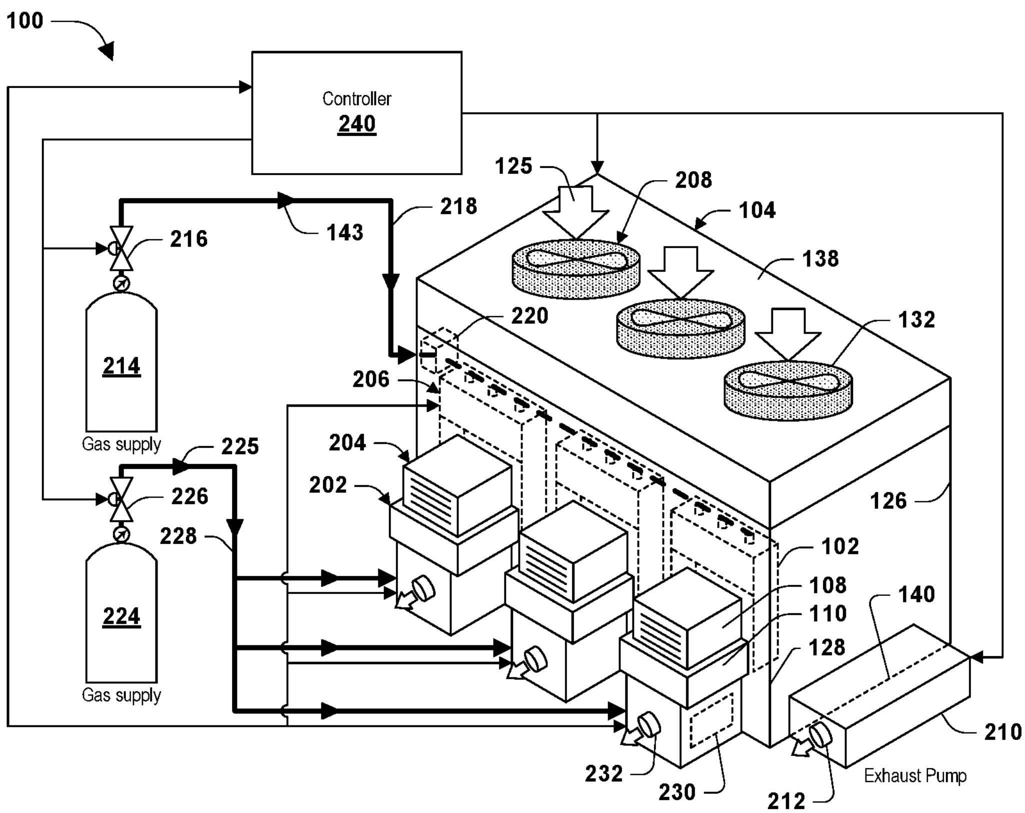
FIG. 2 is a perspective view of a processing arrangement, according to some embodiments.

FIG. 2 is a perspective view of the processing arrangement 100, according to some embodiments. In some embodiments, the processing arrangement 100 includes a plurality of load ports 202, including the load port 110, and a plurality of wafer storage devices 204, including the wafer storage device 108, arranged adjacent to the interface module 104. A plurality of flow adjusting units 206, including the flow adjusting unit 102, are arranged above a plurality of openings defined in the wall 128 of the interface module 104. In some embodiments, a plurality of fan filter units 208, including the fan filter unit 132, draw air through the top portion 138 of the interface module 104 to create the mini environment within the transfer chamber 126 of the interface module 104. An exhaust pump 210 draws air from within the transfer chamber 126 through the bottom portion 140 of the interface module 104 and exhausts the air from within the transfer chamber 126 through an exhaust port 212. According to various examples, the exhaust pump 210 may include one or more pumps, and/or may utilize multiple pumping technologies, such as a positive displacement pump, a momentum transfer pump, a regenerative pump, and/or an entrapment pump. The exhaust pump 210 may include various pumps configured in series and/or in parallel according to respective sizing and/or number of the plurality of wafer storage devices 204 to be configured to interface with the interface module 104.

In some embodiments, the interface module 104 is provided in a large space clean room (not shown) that provides a clean room environment with lower particle concentration and lower degree of relative humidity than an ambient environment. In some embodiments, the plurality of fan filter units 208 receive air from the clean room and the exhaust pump 210 exhausts air from within the transfer chamber 126 of the interface module 104 to the clean room. In some embodiments, the plurality of fan filter units 208 receive gas from a source external to the clean room and the exhaust pump 210 exhausts gas from within the transfer chamber 126 of the interface module 104 to an external repository outside of the clean room. Other arrangements and/or configurations of the plurality of fan filter units 208 and the exhaust pump 210 are within the scope of the present disclosure.

In some embodiments, the processing arrangement 100 includes a gas supply 214 to communicate the gas 143 to each of the plurality of flow adjusting units 206 through a gas valve 216 and a gas conduit 218. For example, the gas conduit 218 connects to each of the plurality of flow adjusting units 206 through a gas interface 220. In some embodiments, one or more gas valves, such as the gas valve 216, individually control gas flow within sections of the gas conduit 218 corresponding to each of the plurality of flow adjusting units 206. For example, one or more gas interfaces, such as the gas interface 220, may be associated with each of the plurality of flow adjusting units 206 to individually supply the gas 143 thereto. In some embodiments, the gas 143 flows downward from each of the plurality of flow adjusting units 206 across corresponding openings in the wall 128 of the interface module 104 before each corresponding interface door is opened to receive a wafer. In some embodiments, the interface doors of the interface module 104 are operated independently to receive corresponding wafers from the plurality of wafer storage devices 204.

In some embodiments, the processing arrangement 100 includes a gas supply 224, such as a second gas supply, to communicate a gas 225 to each of the plurality of load ports 202 through a gas valve 226 and a gas conduit 228. For example, the gas conduit 228 connects to each of the plurality of flow adjusting units 206 through corresponding gas interfaces (not shown). In some embodiments, the gas 225 purges each of the plurality of wafer storage devices 204 when respectively docked in each of the plurality of load ports 202. In some embodiments, one or more exhaust pumps, such as an exhaust pump 230, is connected to and/or exhausts gas from within each of the plurality of wafer storage devices 204 to create and/or maintain corresponding ultra clean environments therein. In some embodiments, gas from within each of the plurality of wafer storage devices 204 is exhausted through one or more exhaust ports, such as an exhaust port 232.

In some embodiments, the processing arrangement 100 includes a controller 240 to control of at least one of the plurality of load ports 202, the plurality of wafer storage devices 204, the plurality of flow adjusting units 206, the plurality of fan filter units 208, the exhaust pump 210, the exhaust pump 230, the gas valve 216, or the gas valve 226. In an example, the controller 240 controls the gas valve 216 corresponding to the gas supply 214 to initiate the gas flow to the first layer 144 of the flow adjusting unit 102 and thereby form an air curtain across the opening 130 in the wall 128 before opening of the storage device door 124 of the wafer storage device 108 and before opening of the interface door 115 of the interface module 104, which are in front of the wafer storage device 108. The controller 240 communicates with the load port 110 to control the storage device door 124 of the wafer storage device 108 to open. The controller 240 communicates with the interface module 104 to control the interface door 115 of the interface module 104 to open. In an example, upon opening of the storage device door 124 and the interface door 115, the controller 240 controls the operating machine 109 to retrieve the wafer 106 and/or one or more of the plurality of wafers 107 from the wafer storage device 108. In an example, upon opening of the storage device door 124 and the interface door 115, the controller 240 controls the operating machine 109 to transfer the wafer 106 and/or one or more of the plurality of wafers 107 to the wafer storage device 108. After retrieval and/or transfer of one or more wafers, the controller 240 communicates with the load port 110 to control the storage device door 124 of the wafer storage device 108 to close. The controller 240 communicates with the interface module 104 to control the interface door 115 of the interface module 104 to close. The controller 240 then controls the gas valve 216 corresponding to the gas supply 214 to halt the gas flow to the first layer 144 of the flow adjusting unit 102 and thereby cease formation of the air curtain from across the opening 130.

In some embodiments, the controller 240 controls the gas valve 226 corresponding to the gas supply 224 to initiate a gas purge within the wafer storage device 108 before initiating transfer of the wafer 106 and/or one or more of the plurality of wafers 107 between the wafer storage device 108 and the interface module 104. In some embodiments, one or more gas valves, such as gas valve 226, respond to the controller 240 to individually control flow of gas within sections of the gas conduit 228 corresponding to each of the plurality of load ports 202. In some embodiments, one or more gas valves, such as gas valve 216, respond to the controller 240 to individually control flow of gas within sections of the gas conduit 218 corresponding to each of the plurality of flow adjusting units 206. In some embodiments, flow of the gas 143 to each of the plurality of flow adjusting units 206 is controlled individually. In some embodiments, flow of the gas 143 to each of the plurality of flow adjusting units 206 is controlled collectively, such that two or more flow adjusting units of the plurality of flow adjusting units 206 receive flow of the gas 143 at the same time. Other arrangements and/or configurations for controlling the interface module 104, the plurality of load ports 202, the plurality of wafer storage devices 204, the plurality of flow adjusting units 206, the flow of the gas 143 from the gas supply 214, and/or the flow of the gas 225 from the gas supply 224 are within the scope of the present disclosure.

Figure 3A:
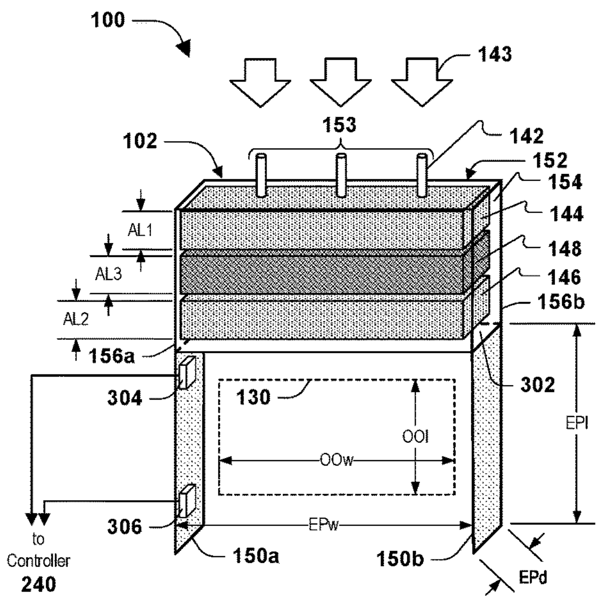
FIG. 3A is a perspective view and FIG. 3B is a schematic front view of a processing arrangement, according to some embodiments.
Figure 3B:
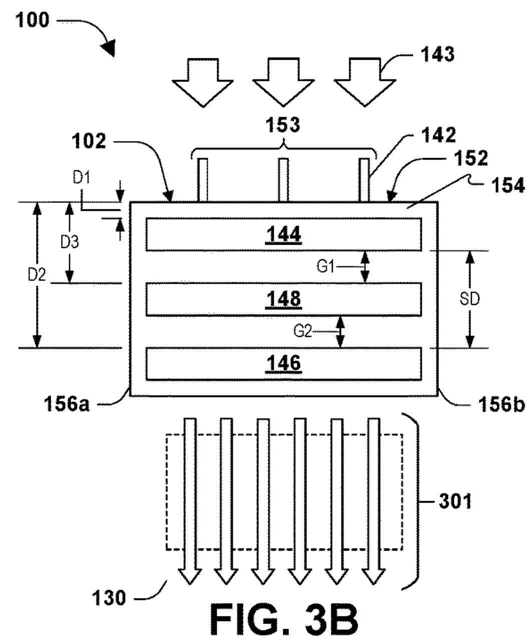

FIG. 3A is a perspective view and FIG. 3B is a schematic front view of the processing arrangement 100 including the flow adjusting unit 102, according to some embodiments. In some embodiments, the housing 152 is configured to retain the first layer 144, the second layer 146, and/or the third layer 148 above the opening 130 in the wall 128 of the interface module 104. In some embodiments, the first layer 144, the second layer 146, and/or the third layer 148 are configured to provide an air curtain 301, such as a downward directed vertical air curtain, across the opening 130 to inhibit contamination of the wafer storage device 108 (shown in FIG. 1A). When the gas 143 exists from the plurality of gas nozzles 153, such as the gas nozzle 142, the gas may exhibit turbulent air flow. The plurality of gas nozzles 153 communicate the gas 143 to an interior chamber 302 of the housing 152 under control of the controller 240. In some embodiments, the gas 143 is supplied at a flow great greater than 30 liters per minute (LPM), such as between 35 LPM and 50 LPM, or between 40 LPM and 45 LPM. The gas 143 flows through the housing 152 and creates the air curtain 301 in front of the opening 130. In some embodiments, a flow rate of the air curtain 301 is less than a flow rate provided by the fan filter unit 132 to the mini environment of the interface module 104. One or more gas sensors, such as a first gas sensor 304 or a second gas sensor 306, may be placed at least one of within the housing 152, below the housing 152, or attached to one the extension plates 150*a,b* below the housing, to monitor a flow rate of the gas 143 output through the second layer 146. In some embodiments, the one or more gas sensors may communicate exit flow rate information to the controller 240.

In some embodiments, the first gas sensor 304 or the second gas sensor 306 is at least one of a Pirani heat loss gauge and/or an atmospheric reference gauge to measure and transmit the exit flow rate information to the controller 240. A Pirani heat loss gauge may be configured as a thin metal wire, such as Nickel, suspended in a tube. The thin metal wire may change in electrical potential across a Wheatstone bridge circuit in response to pressure and/or exit flow rate of the gas 143. In an example, the first gas sensor 304 or the second gas sensor 306 may be configured as a micro-electro-mechanical system (MEMS) Pirani vacuum transducer. The first gas sensor 304 or the second gas sensor 306 may be configured to provide an absolute exit flow rate measurement or a relative flow rate measurement, which is the communicated to the controller 240 for comparison with the supplied gas pressure output from the gas supply 214. In an example, the first gas sensor 304 or the second gas sensor 306 is configured as a capacitance manometer to measure absolute and/or relative exit flow rate of the gas 143, or a combination of a Pirani gauge and a capacitance manometer. A Pirani gauge may change in detected pressure and/or flow rate (e.g., an increase of 60% higher than a capacitance manometer) in the presence of water vapor. In some embodiments, a combination of a Pirani gauge and a capacitance manometer are provided to communicate exit flow rate of the gas 143 and moisture information corresponding to a % RH of the gas 143 exiting from the second layer 146. In some embodiments, the first gas sensor 304 detects a first flow rate of the gas 143 output through the second layer 146 at a first location and the second gas sensor 306 detects a second flow rate of the gas 143 output through the second layer 146 at a second location. Fluctuations of detected measurements by the first gas sensor 304 and/or the second gas sensor 306, such as present during initial supply of the gas 143 to the housing 152, are analyzed by the controller 240. The fluctuations in the detected measurements may be reduced below a threshold, such as less than 10% fluctuations, when laminar flow of the gas 143 exiting from the housing 152 and/or laminar flow of the air curtain 301 is obtained. When the detected measurements fall below the threshold, the controller 240 may initiate and/or execute subsequent operations, such as opening the storage device door 124 of the wafer storage device 108, opening the interface door 131 of the interface module 104, and/or transferring the wafer 106 with the operating machine 109. Other arrangements and/or configurations of the first gas sensor 304 and/or the second gas sensor 306 are within the scope of the present disclosure.

In some embodiments, the housing 152 retains the first layer 144, the second layer 146, and/or the third layer 148 above the opening 130. In some embodiments, the first layer 144 has a first thickness AL1, the second layer 146 has a second thickness AL2, and the third layer 148 has a third thickness AL3. In some embodiments, the first thickness AL1 of the first layer 144 is between 1 millimeter (mm) and 20 centimeters (cm), such as between 5 mm and 10 cm, between 1 cm and 8 cm, or about 5 cm. The first thickness AL1 may vary in accordance with the type and flow rate of the gas 143, and/or a number of flow layers retained within the housing 152. In some embodiments, as shown in FIG. 3B, the first layer 144 is a first distance D1 below the gas nozzle 142.

In some embodiments, the second layer 146 is retained within the housing 152 below the first layer 144. In some embodiments, the second thickness AL2 of the second layer 146 is between 1 mm and 30 cm, such as between 5 mm and 20 cm, between 1 cm and 15 cm, or about 10 cm. The second thickness AL2 may be changed in accordance with the type and flow rate of the gas 143 to be communicated through the second layer 146, a number of flow layers configured above the second layer 146, and/or a distance of the second layer 146 above the opening 130 in the wall 128 of the interface module 104. In some embodiments, as shown in FIG. 3B, the second layer 146 is a second distance D2 greater than the first distance D1 below the gas nozzle 142. In some embodiments, as shown in FIG. 3B, the first layer 144 is separated from the second layer 146 by a separation distance SD greater than zero.

In some embodiments, the third layer 148 is retained within the housing 152 between the first layer 144 and the second layer 146. In some embodiments, the third thickness AL3 of the third layer 148 is between 1 mm and 20 cm, such as between 5 mm and 10 cm, between 1 cm and 8 cm, or about 5 cm. The third thickness AL3 may vary in accordance with the type and flow rate of the gas 143, and/or a number of flow layers retained within the housing 152. In some embodiments, as shown in FIG. 3B, the third layer 148 is a third distance D3 below the gas nozzle 142, where the third distance D3 is greater than the first distance D1 but less than the second distance D2. Other arrangements and/or configurations of the thicknesses of the layers and/or the distances of the layers below the gas nozzle 142 are within the scope of the present disclosure.

In some embodiments, the extension plates 150*a,b* are configured below the second layer 146 to constrain the gas 143 output through the second layer 146 and constrain the air curtain 301 across the opening 130. The opening 130 has an opening length OOl and an opening width OOw. In some embodiments, each of the extension plates 150*a,b* has an extension plate length EPl and an extension plate depth EPd, and are separated by an extension plate width EPw. The extension plate length EPl is greater than the opening length OOl and the extension plate width EPw is greater than the opening width OOw such that the extension plates 150*a,b* frame the opening 130. In some embodiments, the housing 152 provides a canopy above the opening 130 and is wider than the opening width OOw. In some embodiments, the extension plates 150*a,b* have a sufficient extension plate length EPl extending from the housing 152 to exceed a bottom level of the opening 130. In some embodiments, the extension plate width EPw is wider than a width of the storage device door 124 of the wafer storage device 108 such that the extension plates 150*a,b* do not block the opening of the storage device door 124, do not block the opening of the interface door 131, and do not interfere with transfer of the wafer 106 by the operating machine 109. In some embodiments, the extension plate depth EPd of the extension plates 150*a,b* is configured to not block an operation space of the operating machine 109 within the transfer chamber 126 of the interface module 104. For example, the extension plate depth EPd of the extension plates 150*a,b* is not greater than 15 cm. In some embodiments, the extension plate depth EPd is configured with sufficient depth to constrain the air curtain 301 about the opening 130. For example, the extension plate depth EPd is not smaller than 2 cm. Other arrangements and/or configuration of the dimensions of the extension plates 150*a,b* are within the scope of the present disclosure.

Figure 4:
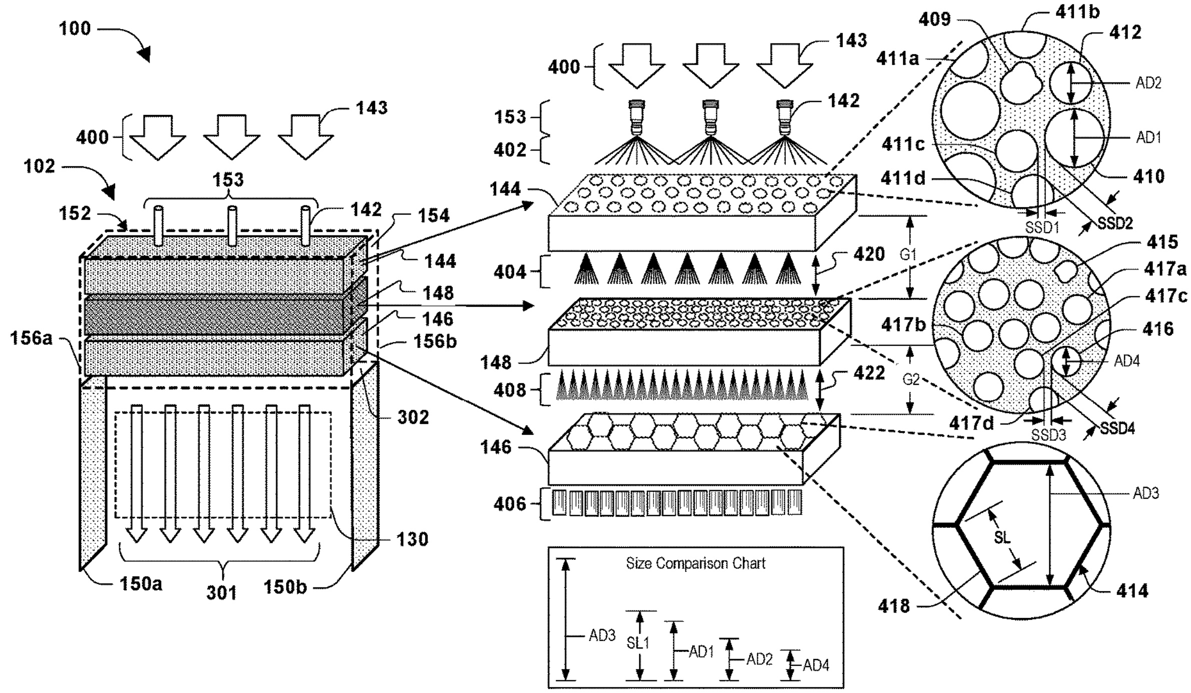
FIG. 4 is a schematic front view of a processing arrangement, according to some embodiments.

FIG. 4 is a schematic front view of the processing arrangement 100 including the flow adjusting unit 102, according to some embodiments. In some embodiments, the gas nozzle 142 and/or the plurality of gas nozzles 153 may receive a gas flow 400 of the gas 143 from the gas supply 214 illustrated in FIG. 2. The gas nozzle 142 and/or the plurality of gas nozzles 153 provides a first gas flow 402 to the first layer 144. The first layer 144 disperses the first gas flow 402 to generate a second gas flow 404 that is directed to the second layer 146. The second layer 146 channels the second gas flow 404, e.g. in a direction parallel to the wall 128 of the interface module 104, to generate a third gas flow 406 directed across the opening 130. In some embodiments, the third layer 148 receive the second gas flow 404 from the first layer 144 and generates a fourth gas flow 408 that is directed to the second layer 146.

In some embodiments, the first layer 144 is separated from the third layer 148 within the housing 152 by a first gap 420 having a first gap distance G1, and the third layer 148 is separated from the second layer 146 within the housing 152 by a second gap 422 having a second gap distance G2. In some embodiments, the first gap distance G1 is a non-zero number between 1 mm and 10 cm, such as 1 cm. In some embodiments, the second gap distance G2 is non-zero number between 1 mm and 10 cm, such as 1 cm. In some embodiments, the first gap 420 is provided such that the first layer 144 is not in direct contact with the third layer 148 and the second gap 422 is provided such that the third layer 148 is not in direct contact with the second layer 146. The first gap 420 enhances laminar flow of the second gas flow 404 between the first layer 144 and the third layer 148. The second gap 422 enhances laminar flow of the fourth gas flow 408 between the third layer 148 and the second layer 146. Other arrangements and/or configurations of the first gap 420 having the first gap distance G1 and the second gap 422 having the second gap distance G2 are within the scope of the present disclosure.

In some embodiments, the first layer 144 is a porous layer defining a first aperture 410 having a first aperture diameter AD1 corresponding to a first aperture size. In some embodiments, the first layer 144 defines a second aperture 412 having a second aperture diameter AD2 corresponding to a second aperture size. In some embodiments, the first layer 144 defines a plurality of apertures including the first aperture 410 and the second aperture 412, where each of the plurality of apertures have a size greater than or equal to the second aperture 412 but less than or equal to the first aperture 410. In some embodiments, the plurality of apertures of the first layer 144 have at least one of a regular shape or an irregular shape and range in size between and/or equal to a size of the first aperture 410 and the second aperture 412. For example, the first layer 144 includes an irregular aperture 409 having an irregular shape. In some embodiments, the first layer 144 includes a plurality of second-sized apertures with varying distances between adjacent apertures. For example, the first layer 144 defines a first second-sized aperture 411*a*, a second second-sized aperture 411*b*, a third second-sized aperture 411*c*, and a fourth second-sized aperture 411*d*. The third second-sized aperture 411*c* is adjacent the first aperture 410 and the fourth second-sized aperture 411*d* is adjacent the first aperture 410. The first aperture 410 and the third second-sized aperture 411*c* are separated by a first distance SSD1 and the first aperture 410 and the fourth second-sized aperture 411*d* are separated by a second distance SSD2. In some embodiments, the first distance SSD1 is less than the second distance SSD2. In some embodiments, the first distance SSD1 is not equal to the second distance SSD2. In some embodiments, the first distance SSD1 is equal to the second distance SSD2.

In some embodiments, the apertures of the first layer 144 are configured such that portions of sides thereof do not have a continuous distance from sides of other apertures of the first layer. In some embodiments, the first layer 144 is a porous layer, such as an ultra-high molecular weight polyethylene (UPE) porous material that defines a plurality of apertures including the first aperture 410 and the second aperture 412. In some embodiments, the first layer 144 is a nonporous material, such as a ridged or semi-rigid plate with a plurality of apertures formed therein. In some embodiments, the first layer 144 is metal, such as stainless steel or aluminum, a non-metal material such as PTFE, PEEK, or POM, or another material that does not generate dust, particles, and/or volatiles and has a small coefficient of friction for the passage of gas therethrough. In some embodiments, the first layer 144 is a mesh material, such as a screen or a combination of randomly formed and joined fibers, or a combination of mesh material(s), defining a plurality of apertures, such as the first aperture 410 or the second aperture 412. In some embodiments, the first aperture diameter AD1 is less than or equal to 5 cm and the second aperture diameter AD2 is less than the first aperture diameter AD1. In some embodiments, the first layer 144 defines the first aperture 410 having a first shape and the second aperture 412 having a second shape different than the first shape.

In some embodiments, the second layer 146 defines a third aperture 414 having a third aperture diameter AD3 corresponding to a third aperture size. In some embodiments, the third aperture size of the third aperture 414 is greater than the first aperture size of the first aperture 410. In some embodiments, the second layer 146 is a rigid grid structure that defines a plurality of apertures, including the third aperture 414, where a size of each of the plurality of apertures is greater than a size of the first aperture 410. In some embodiments, the second layer 146 defines a plurality of apertures, including the third aperture 414, arranged in a grid pattern, such as an n×m matrix of the plurality of apertures. In some embodiments, the second layer 146 defines a plurality of apertures arranged in an n×m grid pattern, where n is an integer greater than or equal to 2 and m is an integer greater than or equal to 2. In some embodiments, the third aperture diameter AD3 of the third aperture 414 is greater than the first aperture diameter AD1 of the first aperture 410. In some embodiments, the third aperture 414 has a polygonal shape. In an example, the polygonal shape of the third aperture 414 is a regular polygon. In some embodiments, the first aperture diameter AD1 of the first aperture 410 in the first layer 144 is less than a side length SL of a side 418 defining the third aperture 414 in the second layer 146. In some embodiments, the first layer 144 has a first number of apertures and the second layer 146 has a second number of apertures less than the first number of apertures. In some embodiments, the first layer 144 has the first number of apertures, the second layer 146 has the second number of apertures less than the first number of apertures, and the third layer 148 has a third number of apertures greater than the first number of apertures.

In some embodiments, the third layer 148 is a porous layer defining a fourth aperture 416 having a fourth aperture diameter AD4 corresponding to a fourth aperture size. In some embodiments, the third layer 148 is a UPE porous material that defines a plurality of apertures including the fourth aperture 416. In some embodiments, the third layer 148 is a nonporous material, such as a ridged or semi-rigid plate with a plurality of apertures formed therein. In some embodiments, the third layer 148 is metal, such as stainless steel or aluminum, a non-metal material such as PTFE, PEEK, or POM, or another material that does not generate dust, particles, and/or volatiles and has a small coefficient of friction for the passage of gas therethrough. In some embodiments, the third layer 148 is a mesh material, such as a screen or a combination of randomly formed and joined fibers, or a combination of mesh material(s), defining a plurality of apertures, such as the fourth aperture 416. In some embodiments, the fourth aperture diameter AD4 of the fourth aperture 416 is less than the second aperture diameter AD2 of the second aperture 412. In some embodiments, the third layer 148 defines a plurality of apertures, including the fourth aperture 416, where each of the plurality of apertures has a size less than a size of the second aperture 412. In some embodiments, the plurality of apertures of the third layer 148 have at least one of a regular shape or an irregular shape and range in size less than a size of the second aperture 412.

In some embodiments, the plurality of apertures of the third layer 148 have at least one of a regular shape or an irregular shape and range in size less than the second aperture 412 of the first layer 144. For example, the third layer 148 includes an irregular aperture 415 having an irregular shape. In some embodiments, the third layer 148 includes a plurality of third-sized apertures with varying distances between adjacent apertures. For example, the third layer 148 defines a first third-sized aperture 417*a*, a second third-sized aperture 417*b*, a third third-sized aperture 417*c*, and a fourth third-sized aperture 417*d*. The third third-sized aperture 417*c* is adjacent the fourth aperture 416 and the fourth third-sized aperture 417*d* is adjacent the fourth aperture 416. The fourth aperture 416 and the third third-sized aperture 417*c* are separated by a third distance SSD3 and the fourth aperture 416 and the fourth third-sized aperture 417*d* are separated by a fourth distance SSD4. In some embodiments, the third distance SSD3 is less than the fourth distance SSD4. In some embodiments, the third distance SSD3 is not equal to the fourth distance SSD4. In some embodiments, the third distance SSD3 is equal to the fourth distance SSD4. Other arrangements and/or configurations of the first layer 144, the second layer 146, and/or the third layer 148 are within the scope of the present disclosure.

Figure 5A:
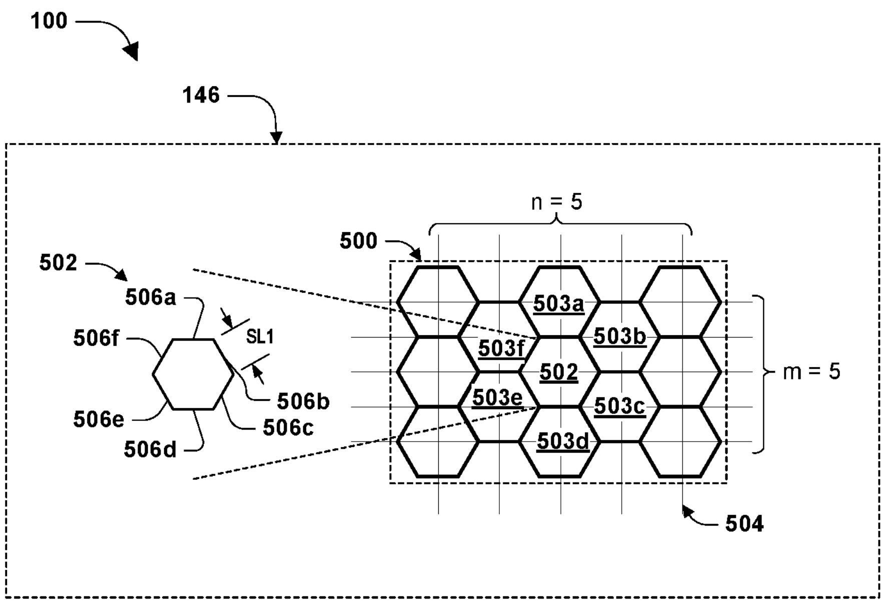
FIGS. 5A-5D are schematic illustrations of a processing arrangement, according to some embodiments.

FIGS. 5A-5D are schematic illustrations of the processing arrangement 100 including the second layer 146, according to some embodiments. As shown in FIG. 5A, the second layer 146 of the processing arrangement 100 includes a plurality of apertures, which are represented by a section of apertures 500, according to some embodiments. In some embodiments, the second layer 146 includes the section of apertures 500 arranged in a grid pattern defined by a grid 504. A grid pattern is a network of intersecting parallel lines that repeat in a regular fashion. For example, as shown in FIG. 5A, the grid 504 defines a grid pattern that includes intersections of parallel lines where each aperture in the section of apertures 500 corresponds to an intersection of the parallel lines. In some embodiments, the section of apertures 500 are arranged in an n×m matrix, where n is an integer, greater than 2, corresponding to a number of apertures across the horizontal axis of the grid 504 and m is an integer, greater than 2, corresponding to a number of apertures across the vertical axis of the grid 504. For example, as shown in FIG. 5A, each aperture in the section of apertures 500 is arranged in an n×m matrix, where n=5 and m=6. The grid 504 and the section of apertures 500 corresponding to the grid pattern defined by the grid 504 repeat laterally across the second layer 146.

In some embodiments, the section of apertures 500 includes a first aperture 502 configured as a polygon. For example, the first aperture 502 is configured as a regular hexagon, including six sides 506*a-f*, where each side has a side length SL1. In some embodiments, the first aperture 502 is laterally adjacent to six second apertures 503*a-f*, each configured as regular hexagons, such that at least one side of the first aperture 502 is continuous with at least one side of each of the second apertures 503*a-f*.

In some embodiments, layers above the second layer 146, such as within the housing 152 of the flow adjusting unit 102, are configured to define apertures with corresponding aperture diameters that are less than the side length SL1 of the first aperture 502. In an example, with reference to FIG. 4, the first aperture diameter AD1 of the first aperture 410 of the first layer 144 is less than the side length SL1 of the first aperture 502 of the second layer 146. In an example, with reference to FIG. 4, the second aperture diameter AD2 of the second aperture 412 of the first layer 144 is less than the side length SL1 of the first aperture 502 of the second layer 146. In an example, with reference to FIG. 4, the fourth aperture diameter AD4 of the fourth aperture 416 of the third layer 148 is less than the side length SL1 of the first aperture 502 of the second layer 146. Other arrangements and/or configurations of the plurality of apertures of the second layer 146, which are represented by the section of apertures 500 and include the first aperture 502, are within the scope of the present disclosure.

Figure 5B:
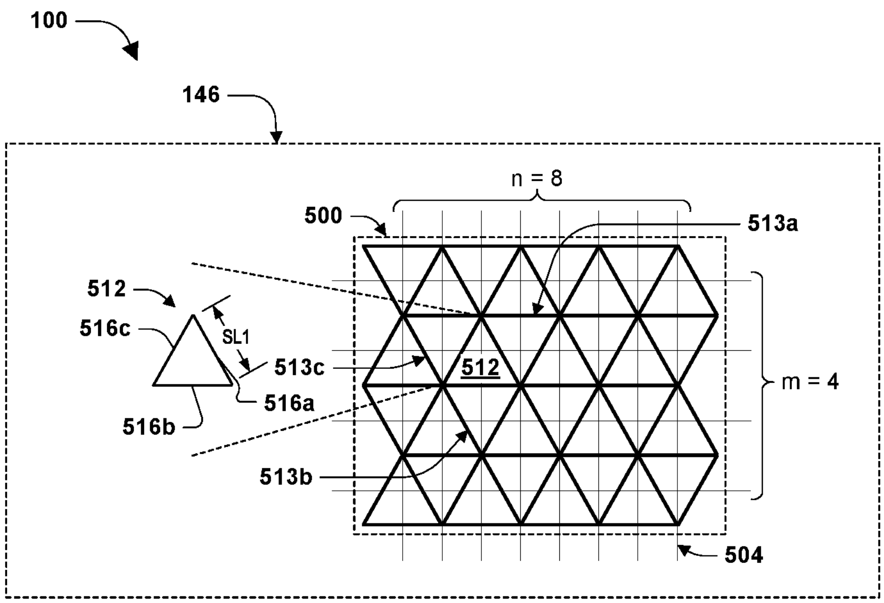

As shown in FIG. 5B, the second layer 146 of the processing arrangement 100 includes a plurality of apertures, which are represented by the section of apertures 500, according to some embodiments. In some embodiments, the section of apertures 500 are arranged in a grid pattern in the second layer 146. The grid 504 defines a grid pattern that includes intersections of parallel lines where each aperture in the section of apertures 500 corresponds to an intersection of the parallel lines. In some embodiments, the section of apertures 500 are arranged in an n×m matrix, where n is an integer, greater than 2, corresponding to a number of apertures across the horizontal axis of the grid 504 and m is an integer, greater than 2, corresponding to a number of apertures across the vertical axis of the grid 504. For example, each aperture in the section of apertures 500 is arranged in an n×m matrix, where n=8 and m=4. The grid 504 and the section of apertures 500 corresponding to the grid pattern defined by the grid 504 repeat laterally across the second layer 146.

In some embodiments, the section of apertures 500 includes a first aperture 512 configured as a polygon. For example, the first aperture 512 is configured as a regular triangle, including three sides 516*a-c*, where each side has a side length SL1. In some embodiments, the first aperture 512 is laterally adjacent to three second apertures 513*a-c* such that at least one side of the first aperture 512 is continuous with at least one side of the second apertures 513*a-c*.

In some embodiments, layers above the second layer 146, such as within the housing 152 of the flow adjusting unit 102, are configured to define apertures with corresponding aperture diameters that are less than the side length SL1 of the first aperture 512. In an example, with reference to FIG. 4, the first aperture diameter AD1 of the first aperture 410 of the first layer 144 is less than the side length SL1 of the first aperture 512 of the second layer 146. In an example, with reference to FIG. 4, the second aperture diameter AD2 of the second aperture 412 of the first layer 144 is less than the side length SL1 of the first aperture 512 of the second layer 146. In an example, with reference to FIG. 4, the fourth aperture diameter AD4 of the fourth aperture 416 of the third layer 148 is less than the side length SL1 of the first aperture 512 of the second layer 146. Other arrangements and/or configurations of the plurality of apertures of the second layer 146, which are represented by the section of apertures 500 and include the first aperture 512, are within the scope of the present disclosure.

Figure 5C:
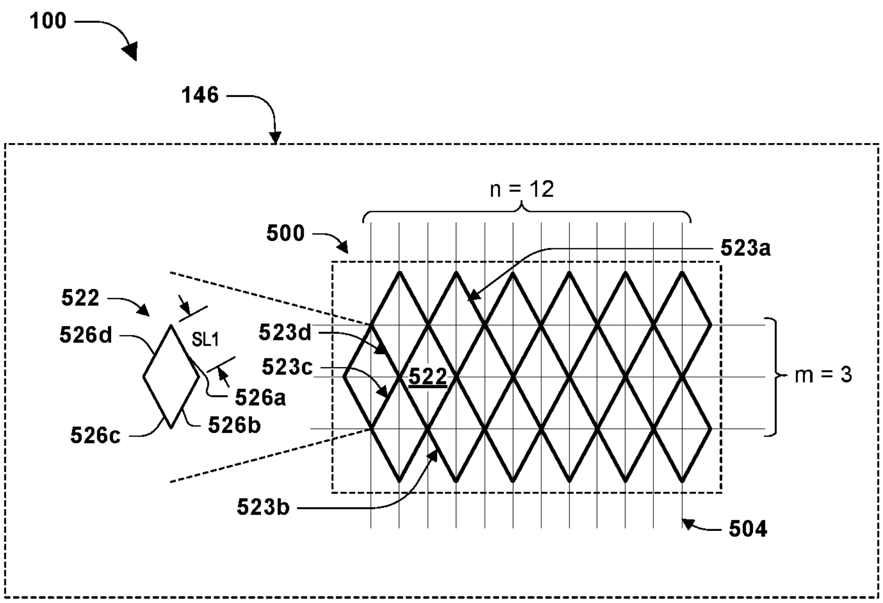

As shown in FIG. 5C, the second layer 146 of the processing arrangement 100 includes a plurality of apertures, which are represented by the section of apertures 500, according to some embodiments. In some embodiments, the section of apertures 500 are arranged in a grid pattern in the second layer 146. The grid 504 includes intersections of parallel lines where each aperture in the section of apertures 500 corresponds to an intersection of the parallel lines. In some embodiments, the section of apertures 500 are arranged in an n×m matrix, where n is an integer, greater than 2, corresponding to a number of apertures across the horizontal axis of the grid 504 and m is an integer, greater than 2, corresponding to a number of apertures across the vertical axis of the grid 504. For example, each aperture in the section of apertures 500 is arranged in an n×m matrix, where n=12 and m=3. The grid 504 and the section of apertures 500 corresponding to the grid pattern defined by the grid 504 repeat laterally across the second layer 146.

In some embodiments, the section of apertures 500 includes a first aperture 522 configured as a polygon. For example, the first aperture 522 is configured as a regular diamond, including four sides 526*a-d*, where each side has a side length SL1. In some embodiments, the first aperture 522 is laterally adjacent to four second apertures 523*a-d* such that at least one side of the first aperture 522 is continuous with at least one side of the second apertures 523*a-d*.

In some embodiments, layers above the second layer 146, such as within the housing 152 of the flow adjusting unit 102, are configured to define apertures with corresponding aperture diameters that are less than the side length SL1 of the first aperture 522. In an example, with reference to FIG. 4, the first aperture diameter AD1 of the first aperture 410 of the first layer 144 is less than the side length SL1 of the first aperture 522 of the second layer 146. In an example, with reference to FIG. 4, the second aperture diameter AD2 of the second aperture 412 of the first layer 144 is less than the side length SL1 of the first aperture 522 of the second layer 146. In an example, with reference to FIG. 4, the fourth aperture diameter AD4 of the fourth aperture 416 of the third layer 148 is less than the side length SL1 of the first aperture 522 of the second layer 146. Other arrangements and/or configurations of the plurality of apertures of the second layer 146, which are represented by the section of apertures 500 and include the first aperture 522, are within the scope of the present disclosure.

Figure 5D:
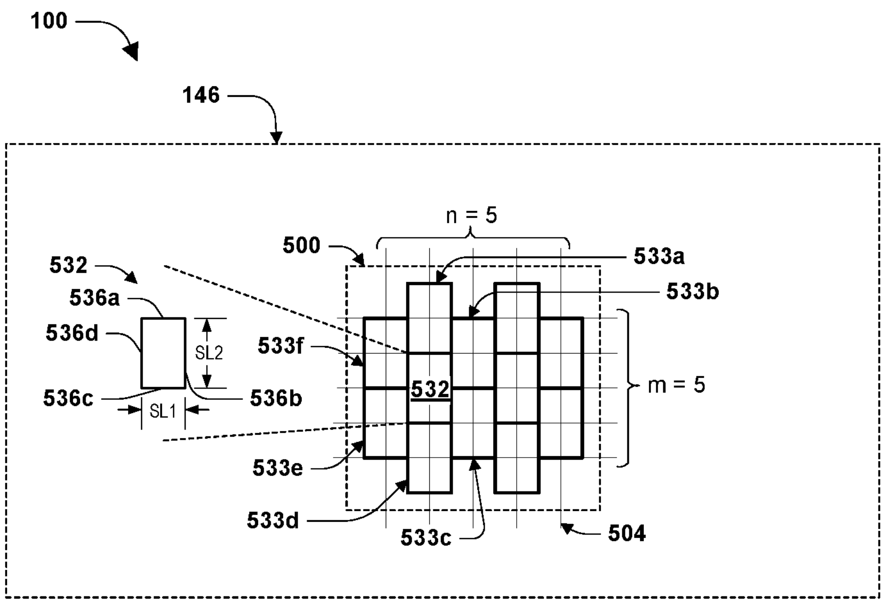

As shown in FIG. 5D, the second layer 146 of the processing arrangement 100 includes a plurality of apertures, which are represented by the section of apertures 500, according to some embodiments. In some embodiments, the section of apertures 500 are arranged in a grid pattern in the second layer 146. The grid 504 includes intersections of parallel lines where each aperture in the section of apertures 500 corresponds to an intersection of the parallel lines. In some embodiments, the section of apertures 500 are arranged in an n×m matrix, where n is an integer greater than 2 corresponding to a number of apertures across the horizontal axis of the grid 504 and m is an integer greater than 2 corresponding to a number of apertures across the vertical axis of the grid 504. For example, each aperture in the section of apertures 500 is arranged in an n×m matrix, where n=5 and m=5. The grid 504 and the section of apertures 500 corresponding to the grid pattern defined by the grid 504 repeat laterally across the second layer 146.

In some embodiments, the section of apertures 500 includes a first aperture 532 configured as a polygon. For example, the first aperture 522 is configured as a regular rectangle, including four sides 536*a-d*, where side 536*a* and side 536*c* have a side length SL1 and side 536*b* and side 536*d* have a side length SL2. In some embodiments, the first aperture 532 is laterally adjacent to six second apertures

533*a-f* such that at least one side of the first aperture 532 is continuous with at least one side of the second apertures 533*a-f*.

In some embodiments, layers above the second layer 146, such as within the housing 152 of the flow adjusting unit 102, are configured to define apertures with corresponding aperture diameters that are less than the side length SL1 of the first aperture 532. In an example, with reference to FIG. 4, the first aperture diameter AD1 of the first aperture 410 of the first layer 144 is less than the side length SL1 of the first aperture 532 of the second layer 146. In an example, with reference to FIG. 4, the second aperture diameter AD2 of the second aperture 412 of the first layer 144 is less than the side length SL1 of the first aperture 532 of the second layer 146. In an example, with reference to FIG. 4, the fourth aperture diameter AD4 of the fourth aperture 416 of the third layer 148 is less than the side length SL1 of the first aperture 532 of the second layer 146. Other arrangements and/or configurations of the plurality of apertures of the second layer 146, which are represented by the section of apertures 500 and include the first aperture 532, are within the scope of the present disclosure.

Figure 6:
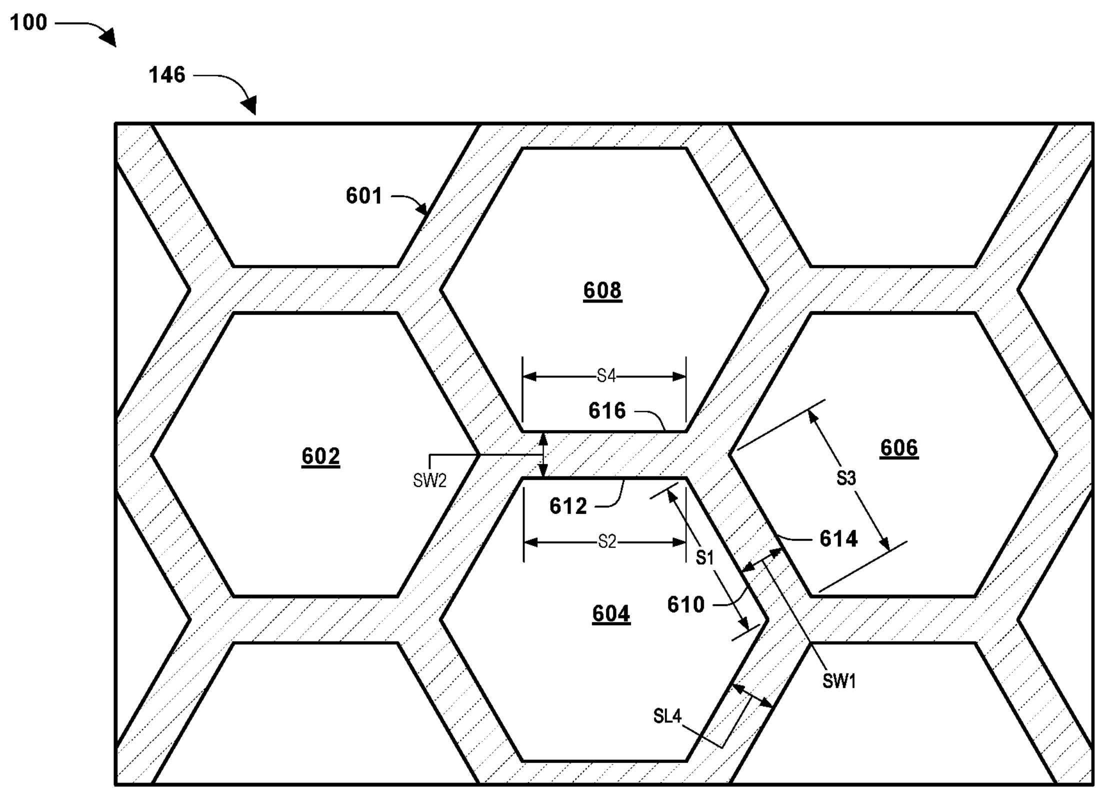
FIG. 6 is a detailed schematic illustration of a processing arrangement, according to some embodiments.

FIG. 6 is a detailed schematic illustration of the processing arrangement 100 including the second layer 146, according to some embodiments. In some embodiments, the second layer 146 has the second thickness AL2, as illustrated with reference to FIG. 3A, and is between 1 mm and 30 cm, such as between 5 mm and 20 cm, between 1 cm and 15 cm, or about 10 cm. In some embodiments, the second layer 146 includes a structural grid 601 to define a plurality of apertures therein. Each aperture defined by the structural grid 601 has a depth corresponding to the second thickness AL2 of the second layer 146. In an example, the second thickness AL2 of the second layer 146 is the same across a horizontal plane of the second layer 146. In an example, the second thickness AL2 may be changed in accordance with the type and flow rate of the gas 143 to be communicated through the second layer 146, a number of flow layers configured above the second layer 146, and/or a distance of the second layer 146 above the opening 130 in the wall 128 of the interface module 104.

In some embodiments, the second layer 146 includes a first aperture 602, a second aperture 604, a third aperture 606, and a fourth aperture 608. The second aperture 604 is defined by a first side 610 and a second side 612. The third aperture 606 is defined by a third side 614 and the fourth aperture 608 is defined by a fourth side 616. The first side 610 is adjacent the third side 614. The second side 612 is adjacent the fourth side 616. The first side 610 is separated from the third side 614 by a first distance SW1. The third side 614 is separated from the fourth side 616 by a second distance SW2. In some embodiments, the first distance SW1 is equal to the second distance SW2.

In some embodiments, the first side 610 has a first length S1, the second side 612 has a second length S2, the third side 614 has a third length S3, and the fourth side 616 has the fourth length S4. In some embodiments, the first length S1 is equal to the third length S3. In some embodiments, the second length S2 is equal to the fourth length S4. In some embodiments, the first distance SW1 is constant between the first side 610 and the third side 614 along the first length S1 and the third length S3. In some embodiments, the second distance SW2 is constant between the second side 612 and the fourth side 616 along the second length S2 and the fourth length S4. In some embodiments, the first aperture 602, the second aperture 604, the third aperture 606, and the fourth aperture 608 have an identical shape. In some embodiments, the first aperture 602, the second aperture 604, the third aperture 606, and the fourth aperture 608 have an identical side length. In some embodiments, spacing between the first aperture 602 and the second aperture 604 is the same as the spacing between the third aperture 606 and the fourth aperture 608. In some embodiments, spacing between the first aperture 602 and the second aperture 604, the second aperture 604 and the third aperture 606, the third aperture 606 and the fourth aperture 608, and the fourth aperture 608 and the first aperture 602 is the same. In some embodiments, spacing between the first aperture 602 and the second aperture 604, the second aperture 604 and the third aperture 606, the third aperture 606 and the fourth aperture 608, and the fourth aperture 608 and the first aperture 602 is less than or equal to 5 mm. Other arrangements and/or configurations of the first aperture 602, the second aperture 604, the third aperture 606, and the fourth aperture 608 are within the scope of the present disclosure.

Figure 7A:
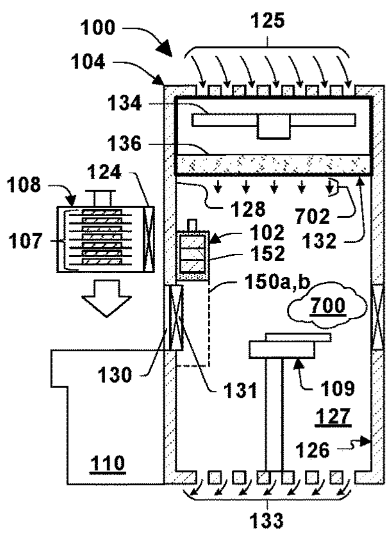
FIGS. 7A-7G are schematic illustrations of a processing arrangement, according to some embodiments.

FIGS. 7A-7G are schematic illustrations of the processing arrangement 100, according to some embodiments. FIGS. 7A-7F illustrate a sequence of operations that may be performed by the processing arrangement 100. For example, the processing arrangement 100 may execute the illustrated sequence of operations in response to control by the controller 240, set forth above with reference to FIG. 4. In an example, the processing arrangement 100 is configured within a clean room having a clean room environment, as set forth above. In an example, the fan unit 134 of the fan filter unit 132 is continually operated to provide a first gas flow 702 into the transfer chamber 126 of the interface module 104, which provides the mini environment, as set forth above. The gas 700 within the transfer chamber 126 is cycled in a downward direction through the transfer chamber 126. With reference to FIG. 7A, in some embodiments, the wafer storage device 108 contains the plurality of wafers 107 for processing by the interface module 104. The storage device door 124 of the wafer storage device 108 is in a closed position to protect the plurality of wafers 107 from contamination, such as contamination through moisture, dust, particles, volatiles, and/or other types of contamination. In some embodiments, the wafer storage device 108 is configured as a FOUP that maintains an ultra clean environment, as set forth above, to house the plurality of wafers 107. The wafer storage device 108 is loaded onto the load port 110. In an example, the wafer storage device 108 may be loaded onto the load port 110 by a human operator. In an example, the wafer storage device may be loaded onto the load port 110 by a mechanical device, such as an OHT.

Figure 7B:
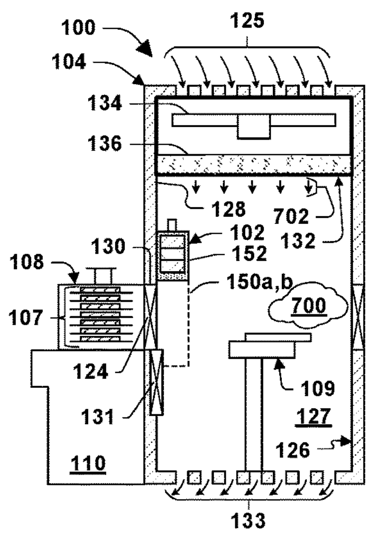

With reference to FIG. 7B, in some embodiments, the wafer storage device is docked onto the load port 110. In some embodiments, the interface module 104 may interface with a plurality of wafer storage devices and/or other processing modules, such as set forth above with reference to FIG. 1A and FIG. 3. For example, the loading and docking of the wafer storage device 108 onto the load port 110 may be communicated to the controller 240 by the load port 110. The docking of the wafer storage device 108 may be entered into a queue maintained by the controller 240 for subsequent batch processing of the plurality of wafers 107 by the interface module 104. When the plurality of wafers 107 within the wafer storage device 108 are queued for processing by the controller 240, the controller 240 confirms that the wafer storage device 108 is sealed with respect to the load port 110 and the interface module 104, then controls the interface door 131 to open. In some embodiments, the controller 240 may control the interface door 131 to open after creation of the air curtain 301, as set forth below with reference to FIG. 7C. The storage device door 124 of the wafer storage device remains closed. In some embodiments, movement of any component within the interface module 104, such as the interface door 131, may create fluctuations and/or turbulence within the mini environment of the transfer chamber 126. After a period of time, such fluctuations and/or turbulence dissipate, such as through continued movement of downwardly directed air within the transfer chamber 126 by the fan filter unit 132.

Figure 7C:
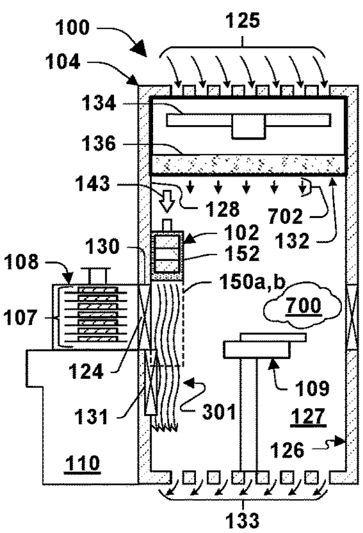

With reference to FIG. 7C, in some embodiments, before processing of the plurality of wafers 107 within the wafer storage device 108, the controller 240 initiates a second gas flow 704, such as the gas 143 set forth above with reference to FIG. 3A, to the flow adjusting unit 102. The second gas flow 704 creates the air curtain 301, also known as an air or gas flow barrier, below the flow adjusting unit 102 and in front of the opening 130. In an example, the air barrier provides laminar air flow across the opening 130 to reduce potential for moisture and/or contamination from the mini environment of the transfer chamber 126 to enter the ultra clean environment of the wafer storage device 108. In some embodiments, the controller 240 determines that the gas 143 has created a laminar flow across the opening 130 before initiating subsequent operations. In an example, the controller 240 waits a predetermined period of time after initiating the flow the gas 143 before initiating subsequent operations. In an example, the controller 240 monitors air pressure supplied by the gas supply 214, set forth above with reference to FIG. 2, and when a predetermined pressure is obtained, initiates subsequent operations. In an example, the controller 240 detects presence of the air curtain 301 across the opening 130 by monitoring responses from one or more gas sensors, such as the first gas sensor 304 and/or the second gas sensor 306 set forth above with reference to FIG. 3A.

Figure 7D:
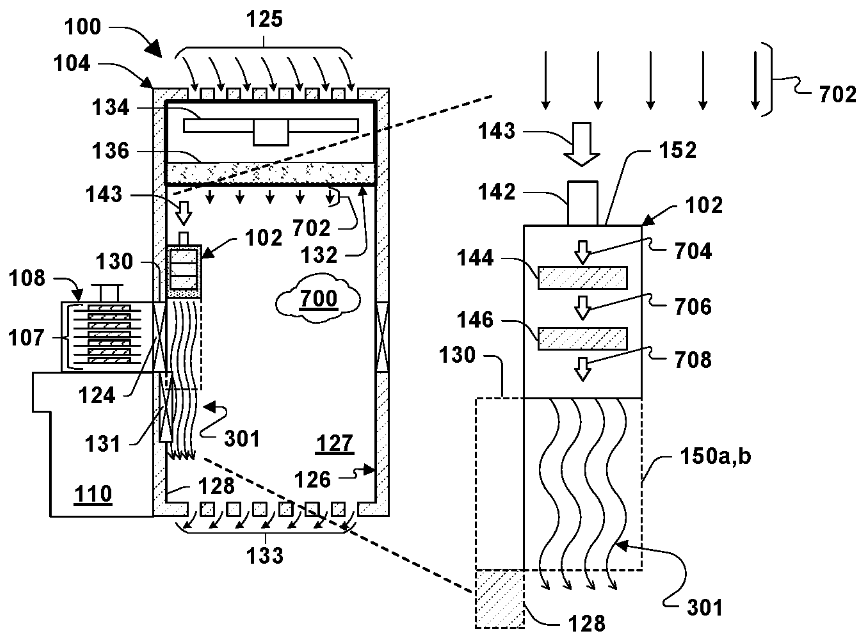

With reference to FIG. 7D, in some embodiments, the processing arrangement 100 includes the fan unit 134 above the transfer space 127 to provide the first gas flow 702 in the transfer space 127. The flow adjusting unit 102 is provided above the opening 130. The gas nozzle 142 supplies the gas 143 to the housing 152 of the flow adjusting unit 102. The first layer 144 is below the gas nozzle 142 and the second layer 146 is below the first layer 144. The gas nozzle 142 provides a second gas flow 704 to the first layer 144 as a result of input pressure from the gas 143. The first layer 144 disperses the second gas flow 704 to generate a third gas flow 706 that is directed to the second layer 146. The second layer 146 channels the third gas flow 706 in a direction parallel to the wall 128 to generate a fourth gas flow 708 that is not directed into the opening 130 and that inhibits the first gas flow from passing through the opening 130. The fourth gas flow 708 forms the air curtain 301. In some embodiments, the first gas flow 702 has a first flow rate and the second gas flow 704 has a second flow rate less than the first flow rate. In an example, the second gas flow 704 has a second flow rate less than the first flow rate to provide laminar flow of air across the opening 130 by the air curtain 301. In an example, the first flow rate is greater than 50 LPM, such as between 50 and 100 LPM, or greater than 100 LPM, and the second flow rate is greater than 30 LPM, such as between 35 and 45 LPM.

Figure 7E:
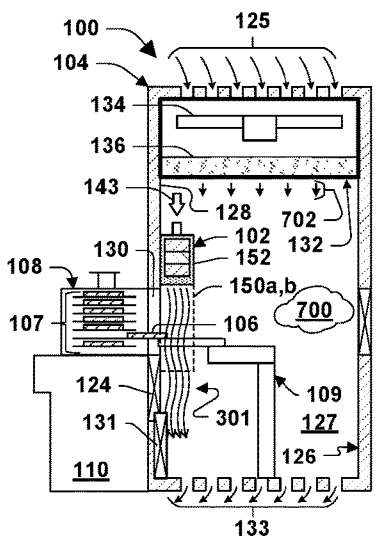

With reference to FIG. 7E, in some embodiments, the controller 240 controls the storage device door 124 of the wafer storage device 108 to open while maintaining presence of the air curtain 301. In some embodiments, the controller 240 may control the interface door 131 to open after creation of the air curtain 301, as set forth above with reference to FIG. 7C. The controller 240 then controls the operating machine 109 to cross the air curtain 301 and transfer the wafer 106 from the wafer storage device 108. In some embodiments, the operating machine 109 transfers some or all of the plurality of wafers 107 from the wafer storage device 108 for batch processing by the interface module 104.

Figure 7F:
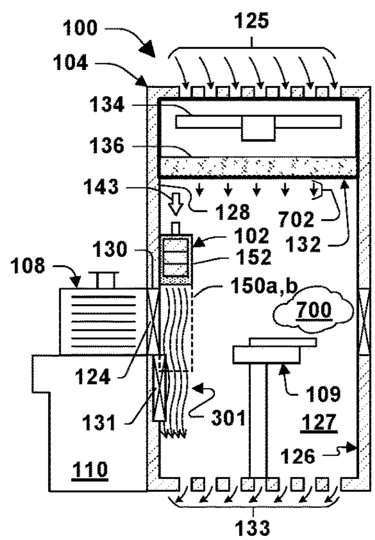

With reference to FIG. 7F, in some embodiments, the controller 240 maintains presence of the air curtain 301 by maintaining flow of the gas 143 to the flow adjusting unit 102 until the controller 240 detects that the storage device door 124 of the wafer storage device 108 is closed. In an example, the controller 240 receives a signal from the load port 110 indicating that the storage device door 124 is closed.

Figure 7G:
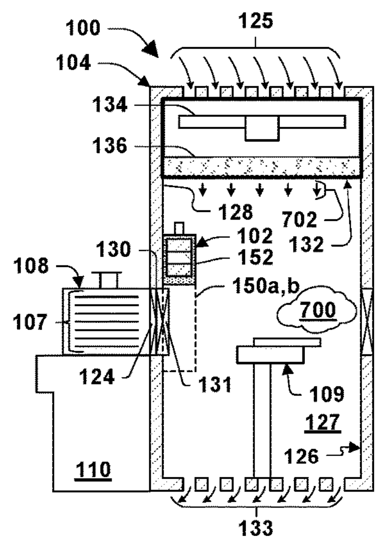

With reference to FIG. 7G, in some embodiments, when the controller 240 detects that the storage device door 124 of the wafer storage device 108 is closed, the controller halts supply of the gas 143 to the flow adjusting unit 102 to remove the presence of the air curtain 301. In some embodiments, the controller 240 controls the interface door 131 to close before halting supply of the gas 143 to the flow adjusting unit 102. In an example, the controller 240 sends a signal to the interface module 104 instructing to close the interface door 131. Other arrangements and/or configurations for controlling the interface module 104, the wafer storage device 108, the operating machine 109, the storage device door 124, the interface door 131, and/or the gas supply 214 are within the scope of the present disclosure.

Figure 8:
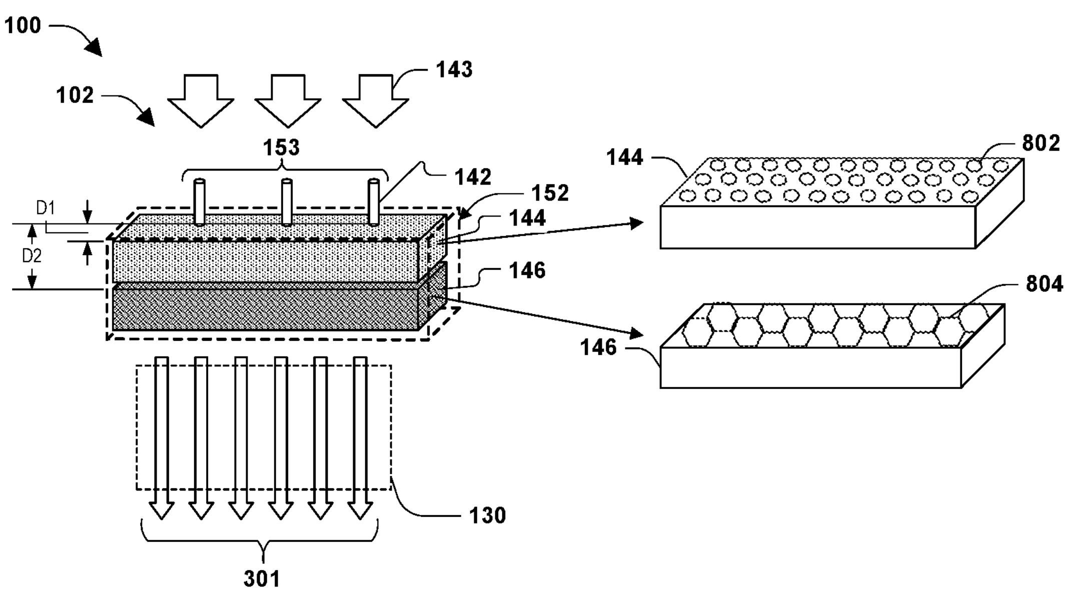
FIG. 8 is a perspective view of a processing arrangement, according to some embodiments.

FIG. 8 is a perspective view of the processing arrangement 100 including the flow adjusting unit 102, according to some embodiments. In some embodiments, the flow adjusting unit 102 includes the housing 152 to support the first layer 144 and the second layer 146. In some embodiments, the housing 152 is configured to retain the first layer 144 and the second layer 146 above the opening 130 in the wall 128 of the interface module 104. In some embodiments, the first layer 144 and the second layer 146 are configured to provide the air curtain 301, such as a downward directed vertical air curtain, across the opening 130 to inhibit contamination of the wafer storage device 108 (shown in FIG. 1A). When the gas 143 exists from the plurality of gas nozzles 153, such as the gas nozzle 142, the gas may exhibit turbulent air flow. The plurality of gas nozzles 153 communicate the gas 143 to the housing 152 under control of the controller 240. In some embodiments, the gas 143 is supplied at a flow rate greater than 30 liters per minute (LPM), such as between 35 LPM and 50 LPM, or between 40 LPM and 45 LPM. In some embodiments, the gas 143 is supplied at a flow rate less than a flow rate of the fan filter unit 132 of the interface module 104. The gas 143 flows through the housing 152 and creates the air curtain 301 in front of the opening 130.

In some embodiments, the flow adjusting unit 102 includes the first layer 144. The first layer 144 defines a first aperture 802, such as the first aperture 410 and/or the second aperture 412 set forth above with reference to FIG. 4, having a first aperture size and provided a distance below the gas nozzle 142, such as the first distance D1 set forth above with reference to FIG. 3B. In some embodiments, the second layer 146 defines a second aperture 804 having a second aperture size greater than the first aperture size of the first aperture 802. The second layer 146 is provided a second distance D2 greater than the first distance D1 below the gas nozzle 142. In some embodiments, the gas nozzle 142 provides a first gas flow to the first layer 144 and the first layer 144 disperses the first gas flow to generate a second gas flow that is directed to the second layer 146. The second layer 146 channels the second gas flow to generate a third gas flow to form the air curtain 301 that is not directed into the opening 130. In some embodiments, the third gas flow is directed across the opening 130. In some embodiments, the second layer 146 defines the second aperture 804 to have a second shape different than a first shape of the first aperture 802. In some embodiments, the second aperture 804 has a polygonal shape, e.g., a regular hexagon, a regular triangle, a regular rectangle, a regular diamond, or another polygonal shape and the first aperture has a non-polygonal shape, such as a circular shape, an oval shape, a curvilinear shape, or other non-polygonal shape. In some embodiments, when the flow adjusting unit 102 has two flow adjusting layers, the layers may have a different flow rate than embodiments of the flow adjusting unit 102 having three or more flow adjusting layers. In an example, the flow adjusting unit 102 includes the first layer 144 and the second layer 146 may achieve a steady state laminar flow rate for the air curtain 301 across the opening 130 quicker because less volume is required to fill the housing 152 before establishing the air curtain 301. Other arrangements and/or configurations of the flow adjusting unit 102 having the first layer 144 and the second layer 146 are within the scope of the present disclosure.

Figure 9:
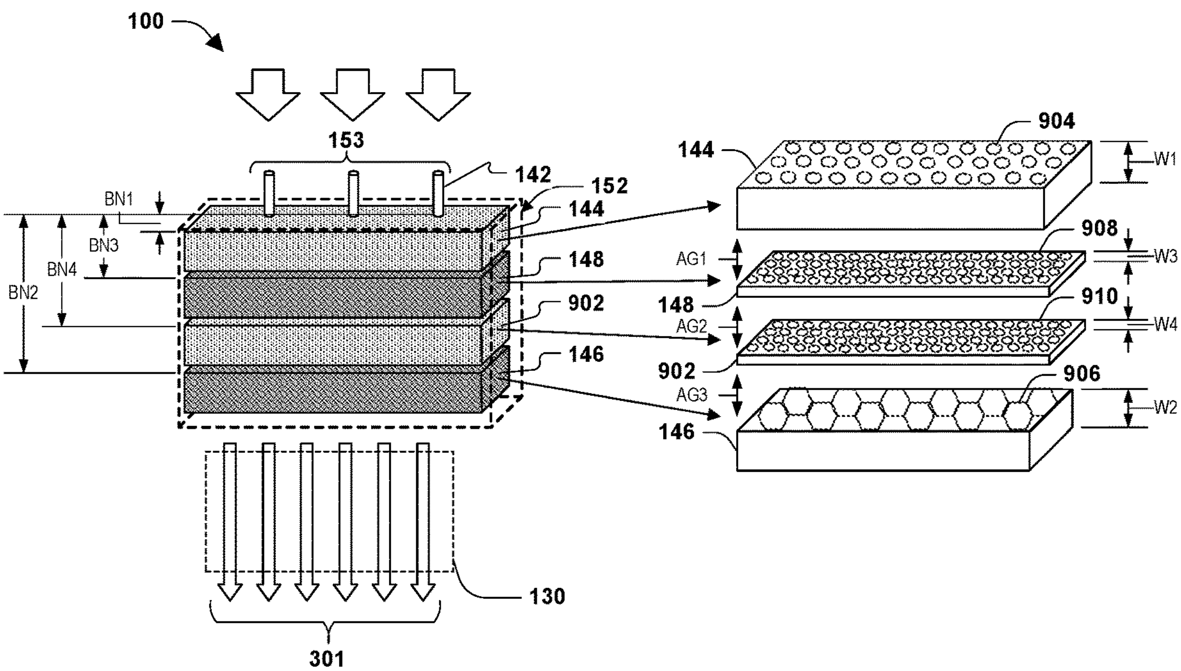
FIG. 9 is a perspective view of a processing arrangement, according to some embodiments.

FIG. 9 is a perspective view of the processing arrangement 100 including the flow adjusting unit 102, according to some embodiments. In some embodiments, the flow adjusting unit 102 includes the first layer 144, the second layer 146, the third layer 148, and one or more additional layers, such as a fourth layer 902, disposed between the second layer 146 and the third layer 148. In some embodiments, the first layer 144 defines one or more apertures, such as a first aperture 904, the second layer 146 defines one or more apertures, such as a second aperture 906, the third layer 148 defines one or more apertures, such as a third aperture 908, and the fourth layer 902 defines one or more apertures, such as a fourth aperture 910. In some embodiments, a size of the second aperture 906 is greater than a size of the first aperture 904, a size of the third aperture 908 is less than the size of the first aperture 904, and a size of the fourth aperture 910 is less than the size of the third aperture 908. In some embodiments, the first aperture 904 is less than or equal to 5 cm. In some embodiments, the second aperture 906 has a polygonal shape, such as set forth above with reference to FIGS. 5A-5D. In some embodiments, the first layer 144 has a first aperture density, the second layer 146 has a second aperture density, the third layer 148 has a third aperture density, and the fourth layer 902 has a fourth aperture density. In some embodiments, the first aperture density is greater than the second aperture density. In some embodiments, the third aperture density is greater than the first aperture density. In some embodiments, the fourth aperture density is greater than the third aperture density. In some embodiments, the fourth aperture density is equal to the third aperture density. In some embodiments where one or more layers, such as the fourth layer 902, are disposed between the second layer 146 and the third layer 148, each of the one or more layers has an aperture density greater than the first aperture density.

In some embodiments, the first layer 144 is disposed a first distance BN1 below the gas nozzle 142, the second layer 146 is disposed a second distance BN2 below the gas nozzle 142, the third layer 148 is disposed a third distance BN3 below the gas nozzle 142, and the fourth layer 902 is disposed a fourth distance BN4 below the gas nozzle 142. In some embodiments, the second distance BN2 is greater than the first distance BN1. In some embodiments, the third distance BN3 is greater than the first distance BN1 but less than the second distance BN2. In some embodiments, the fourth distance BN4 is greater than the third distance BN3 but less than the second distance BN2. In some embodiments where one or more layers, such as the fourth layer 902, are disposed between the second layer 146 and the third layer 148, each of the one or more layers has an associated distance BNx greater than the first distance BN1 but less than the second distance BN2.

In some embodiments, a first gap AG1 is provided between the first layer 144 and the third layer 148. In an example, the first gap AG1 is greater than 1 mm and less than or equal to 10 cm. In some embodiments, a second gap AG2 is provided between the third layer 148 and the fourth layer 902. In an example, the second gap AG2 is greater than 1 mm and less than or equal to 10 cm. In some embodiments, a third gap AG3 is provided between the fourth layer 902 and the second layer 146. In an example, the third gap AG3 is greater than 1 mm and less than or equal to 10 cm. In some embodiments where one or more layers, such as the fourth layer 902, are disposed between the second layer 146 and the third layer 148, each of the one or more layers has an associated gap AGx between adjacent layers greater than 1 mm and less than or equal to 10 cm.

In some embodiments, the first layer 144 has a first thickness W1, the second layer 146 has a second thickness W2, the third layer 148 has a third thickness W3, and the fourth layer 902 has a fourth thickness W4. In some embodiments, the second thickness W2 is greater than the third thickness W3. In some embodiments, the second thickness W2 is greater than the fourth thickness W4. In some embodiments, the first thickness W1 is greater than the third thickness W3. In some embodiments, the first thickness W1 is greater than the fourth thickness W4. In some embodiments where one or more layers, such as the fourth layer 902, are disposed between the second layer 146 and the third layer 148, each of the one or more layers has an associated thickness Wx less than the second thickness W2. Other arrangements and/or configurations of the first layer 144, the second layer 146, the third layer 148, or the fourth layer 902 are within the scope of the present disclosure.

Figure 10:
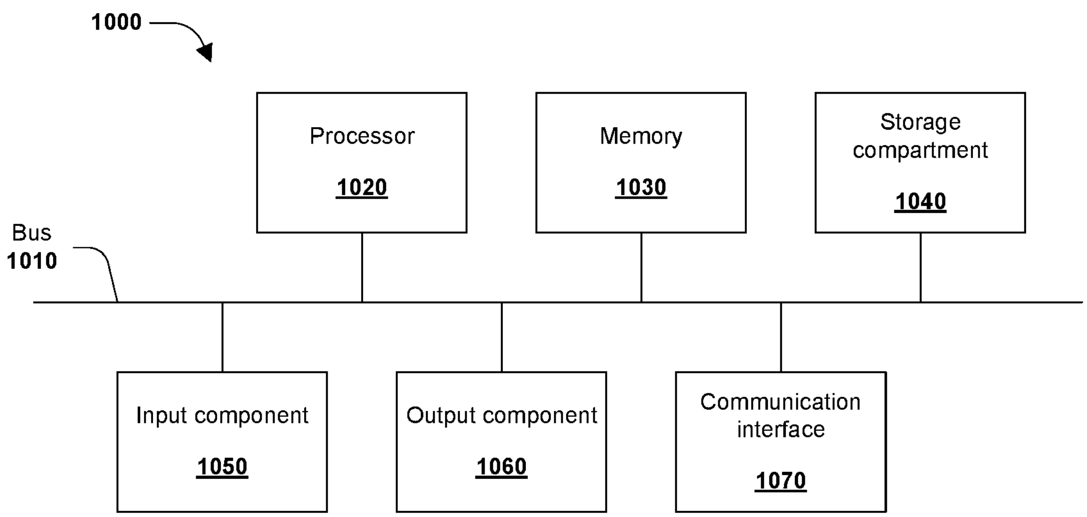
FIG. 10 is a diagram of example components of a device, according to some embodiments.

FIG. 10 is a diagram of example components of a device 1000, according to some embodiments. The device 1000 may correspond to the controller 240 for controlling the processing arrangement 100 and/or the flow adjusting unit 102. As illustrated in FIG. 10, the device 1000 may include a bus 1010, a processor 1020, a memory 1030, a storage component 1040, an input component 1050, an output component 1060, and a communication interface 1070. The bus 1010 includes a component that permits communication among the components of the device 1000. The processor 1020 is implemented in hardware, firmware, or a combination of hardware and software. The processor 1020 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 1020 includes one or more processors capable of being programmed to perform a function. The memory 1030 includes a random access memory (RAM), a read only memory (ROM), and/or another type of dynamic or static storage device (e.g., a flash memory, a magnetic memory, and/or an optical memory) that stores information and/or instructions for use by the processor 1020.

In some embodiments, the storage component 1040 stores information and/or software related to the operation and use of the device 1000. For example, the storage component 1040 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 1050 includes a component that permits the device 1000 to receive information, such as via user input (e.g., a touch screen display, a keyboard, a keypad, a mouse, a button, a switch, and/or a microphone). Additionally, or alternatively, the input component 1050 may include a sensor for sensing information (e.g., a global positioning system (GPS) component, an accelerometer, a gyroscope, and/or an actuator). The output component 1060 includes a component that provides output information from device 1000 (e.g., a display, a speaker, and/or one or more light-emitting diodes (LEDs)). The communication interface 1070 includes a transceiver-like component (e.g., a transceiver and/or a separate receiver and transmitter) that enables the device 1000 to communicate with other devices, such as via a wired connection, a wireless connection, or a combination of wired and wireless connections. The communication interface 1070 may permit the device 1000 to receive information from another device and/or provide information to another device. For example, the communication interface 1070 may include an Ethernet interface, an optical interface, a coaxial interface, an infrared interface, a radio frequency (RF) interface, a universal serial bus (USB) interface, a Wi-Fi interface, a cellular network interface, and/or the like.

In some embodiments, the device 1000 may perform one or more processes described herein. The device 1000 may perform these processes based on the processor 1020 executing software instructions stored by a non-transitory computer-readable medium, such as the memory 1030 and/or the storage component 1040. A computer-readable medium is defined herein as a non-transitory memory device. A memory device includes memory space within a single physical storage device or memory space spread across multiple physical storage devices. Software instructions may be read into the memory 1030 and/or the storage component 1040 from another computer-readable medium or from another device via the communication interface 1070. When executed, software instructions stored in the memory 1030 and/or the storage component 1040 may cause the processor 1020 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 10 are provided as an example. In practice, the device 1000 may include additional components, fewer components, different components, or differently arranged components than those shown in FIG. 10. Additionally, or alternatively, a set of components (e.g., one or more components) of device 1000 may perform one or more functions described as being performed by another set of components of the device 1000.

Figure 11:
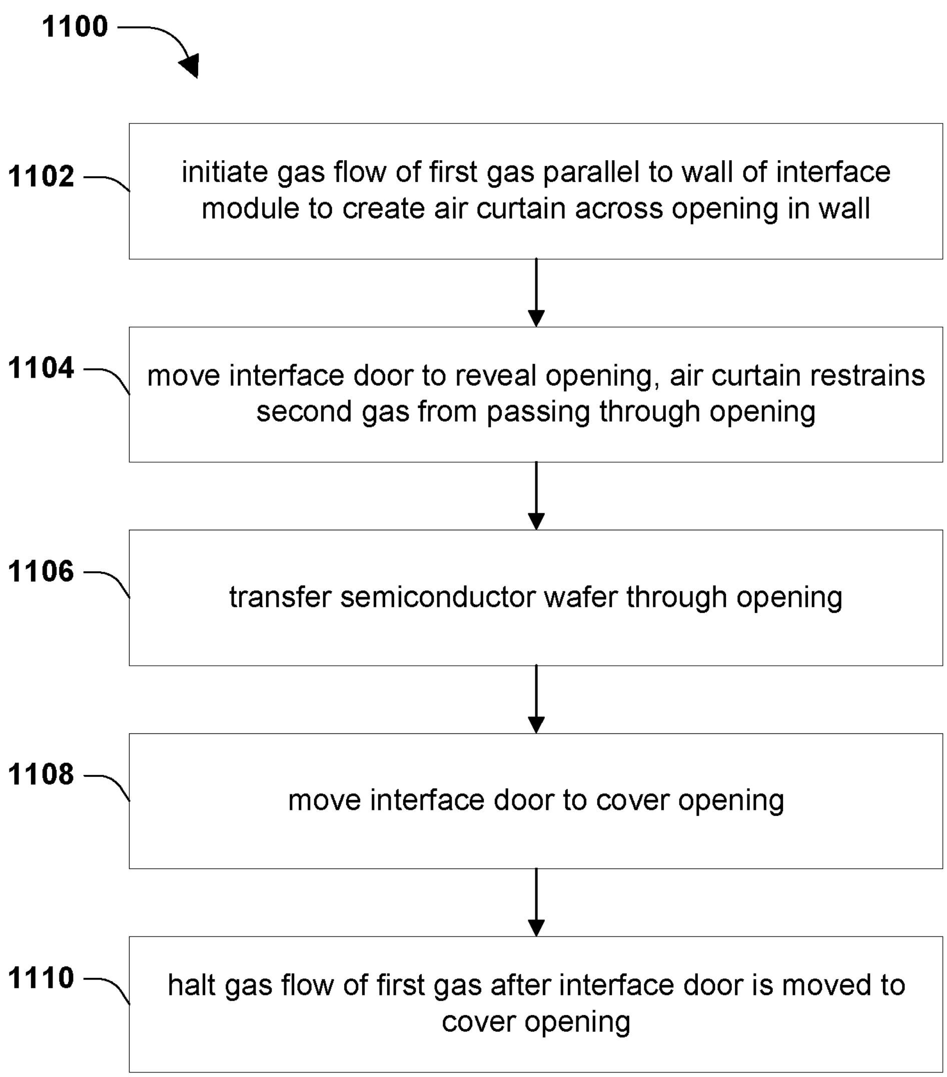
FIG. 11 illustrates an example method, according to some embodiments.

FIG. 11 illustrates an example method 1100, in accordance with some embodiments. At 1102, a gas flow of a first gas is initiated parallel to a wall of an interface module to create an air curtain across an opening defined in the wall. For example in FIG. 7C, the gas flow of the gas 143 is initiated parallel to the wall 128 of the interface module 104 to create the air curtain 301 across the opening 130 defined in the wall 128. At 1104, an interface door is moved to reveal the opening. The air curtain restrains a second gas within the interface module from passing through the opening. For example in FIG. 7C, the interface door 131 is moved to reveal the opening 130 and the air curtain 301 restrains the gas 125 within the interface module from passing through the opening. At 1106, a wafer is transferred through the opening. For example, in FIG. 7E, the wafer 106 is transferred through the opening 130. At 1108, the interface door is moved to cover the opening. For example, in FIG. 7G, the interface door 131 is moved to cover the opening 130. At 1110, the gas flow of the first gas is halted after the interface door is moved to cover the opening. For example, in FIG. 7G, gas flow of the gas 143 is halted after the interface door 131 is moved to cover the opening 130. In some embodiments, the example method 1100 is used in combination with the processing arrangement 100. The processing arrangement 100 and the example method 1100 may have other embodiments, or alternatives, and the example method 1100 is not limited to the processing arrangement 100. The processing arrangement 100 and the example method 1100 may be used to conduct one or a combination of other process operations, such as wafer storage, wafer transfer, etching, deposition, treatment, etc. Other arrangements, configurations, and/or operations of the example method 1100 are within the scope of the present disclosure.

Figure 12:
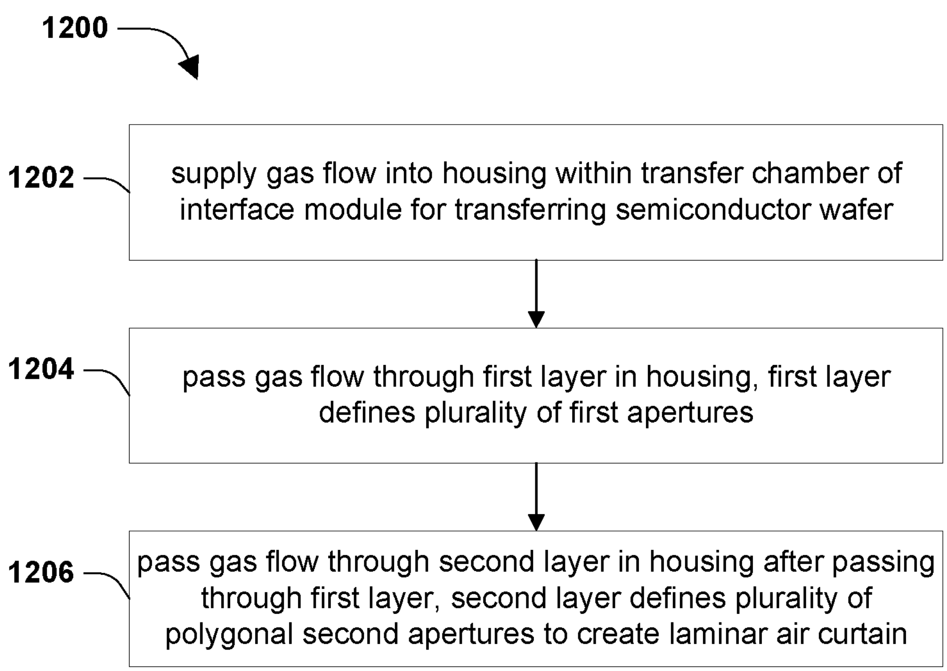
FIG. 12 illustrates an example method, according to some embodiments.

FIG. 12 illustrates an example method 1200, according to some embodiments. At 1202, a gas flow is supplied into a housing disposed within a transfer chamber of an interface module for transferring a semiconductor wafer. For example in FIG. 4, the gas flow 400 is supplied into the housing 152 disposed within the transfer chamber 126 of the interface module 104 (FIG. 1) for transferring the wafer 106 (FIG. 1). At 1204 the gas flow is passed through a first layer in the housing, wherein the first layer defines a plurality of first apertures. For example in FIG. 4, the gas flow 400 is passed through the first layer 144 in the housing 152 to produce the first gas flow 402, wherein the first layer 144 defines a plurality of first apertures 410. At 1206, the gas flow is passed through a second layer in the housing after passing the gas flow through the first layer. The second layer defines a plurality of polygonal second apertures to create, from the gas flow within the housing, a laminar air curtain exiting the housing. For example in FIG. 4, the gas flow 400 is passed through the second layer 146 in the housing 152 to become the third gas flow 406 after passing through the first layer 144. The second layer 146 defines a plurality of polygonal second apertures, such as third aperture 414 to create, from the gas flow 400 within the housing 152, the air curtain 301 exiting the housing 152. In some embodiments, the example method 1200 is used in combination with the processing arrangement 100. The processing arrangement 100 and/or the example method 1200 may have other embodiments or alternatives, and the example method 1200 is not limited to the processing arrangement 100. The processing arrangement 100 and/or the example method 1200 may be used to conduct one or a combination of other process operations, such as wafer storage, wafer transfer, etching, deposition, treatment, etc. Other arrangements, configurations, and/or operations of the example method 1200 are within the scope of the present disclosure.

Figure 13:
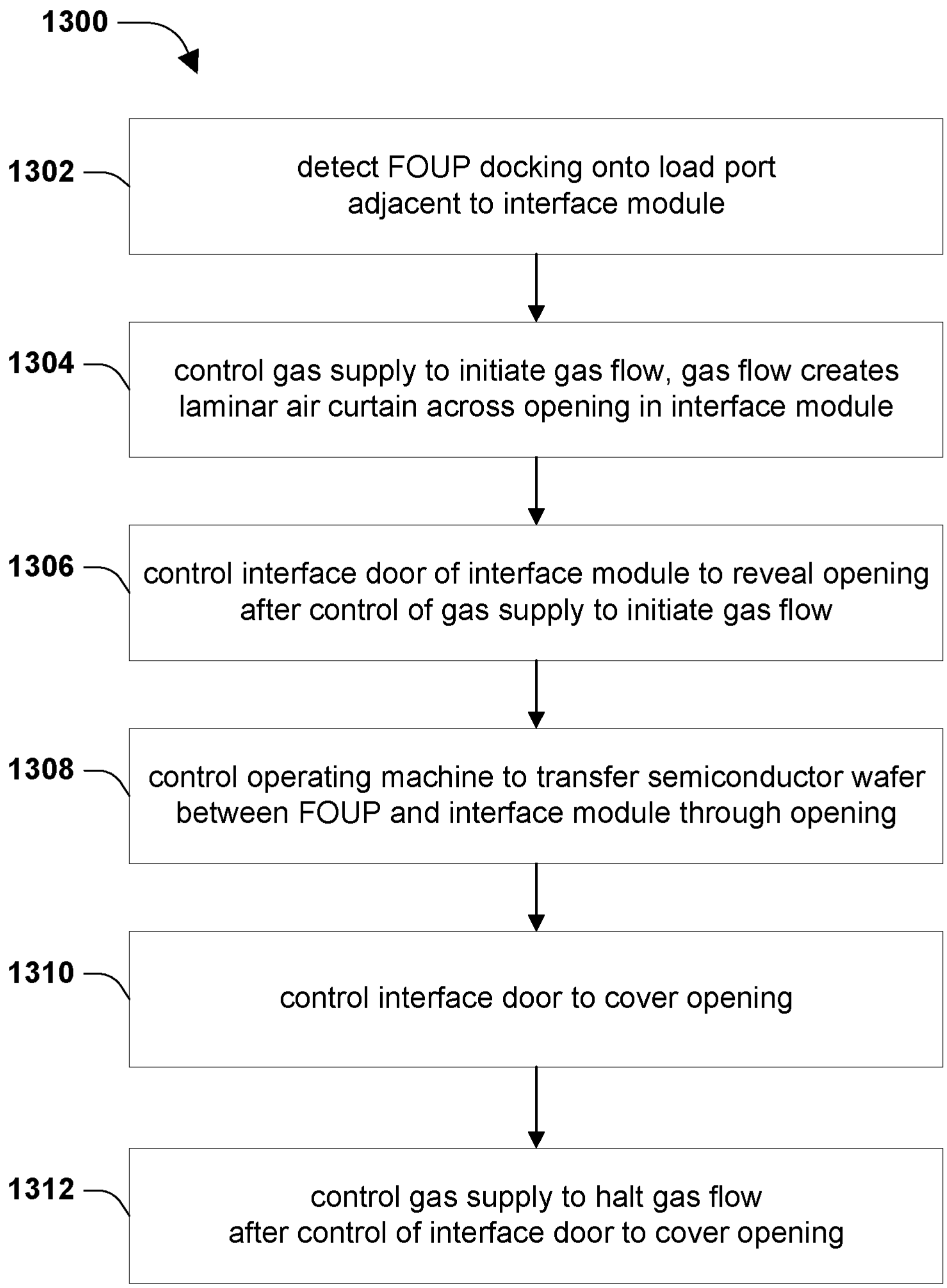
FIG. 13 illustrates an example method, according to some embodiments.

FIG. 13 illustrates an example method 1300, according to some embodiments. At 1302, a front opening unified pod (FOUP) is detected as being docked onto a load port adjacent to an interface module. For example in FIG. 7A, the wafer storage device 108 (e.g., a FOUP) is detected as being docked onto the load port 110 adjacent to the interface module 104. At 1304, a gas supply is controlled to initiate a gas flow, wherein the gas flow creates a laminar air curtain across an opening defined in the interface module. For example the gas supply 214 of FIG. 2 is controlled to initiate the gas flow 400 of FIG. 4, wherein the gas flow 400 creates the air curtain 301 across the opening 130 defined in the interface module 104 (FIG. 1). At 1306, an interface door of the interface module adjacent to the FOUP is controlled to reveal the opening after control of the gas supply to initiate the gas flow. For example in FIG. 7B, the interface door 131 of the interface module 104 adjacent to the wafer storage device 108 is controlled to reveal the opening 130 after control of the gas supply 214 to initiate the gas flow 400 (FIG. 4). At 1308, an operating machine is controlled to transfer a semiconductor wafer between the FOUP and the interface module through the opening. For example in FIG. 7E, the operating machine 109 is controlled to transfer the wafer 106 between the wafer storage device 108 and the interface module 104 through the opening 130. At 1310, the interface door is controlled to cover the opening. At 1312, the gas supply is controlled to halt the gas flow after control of the interface door to cover the opening. For example in FIG. 7G, the gas supply 214 (FIG. 2) is controlled to halt the gas flow 400 (FIG. 4) after control of the interface door 131 to cover the opening 130. In some embodiments, the example method 1300 is used in combination with the processing arrangement 100. The processing arrangement 100 and/or the example method 1300 may have other embodiments or alternatives, and the example method 1300 is not limited to the processing arrangement 100. The processing arrangement 100 and/or the example method 1300 may be used to conduct one or a combination of other process operations, such as wafer storage, wafer transfer, etching, deposition, treatment, etc. Other arrangements, configurations, and/or operations of the example method 1300 are within the scope of the present disclosure.

According to some embodiments, a method includes initiating a gas flow of a first gas parallel to a wall of an interface module to create an air curtain across an opening defined in the wall. The method includes moving an interface door to reveal the opening, wherein the air curtain restrains a second gas within the interface module from passing through the opening. The method includes transferring a semiconductor wafer through the opening and moving the interface door to cover the opening. The method includes halting the gas flow of the first gas after moving the interface door to cover the opening.

In some embodiments, the method includes initiating a gas flow of the second gas in a downward direction within the interface module, wherein the gas flow of the first gas has a first flow rate and the gas flow of the second gas has a second flow rate greater than the first flow rate.

In some embodiments, the method includes exhausting the first gas and the second gas from a lower portion of the interface module such that the air curtain is maintained in a downward direction within a transfer chamber of the interface module across the opening.

In some embodiments, the method includes supplying the gas flow of the first gas into a housing disposed within a transfer chamber of the interface module above the opening. The method includes passing the gas flow of the first gas through a first layer in the housing, wherein the first layer defines a first aperture. The method includes passing the gas flow of the first gas from the first layer through a second layer in the housing, wherein the second layer defines a second aperture having a second aperture size greater than a first size of the first aperture to constrain and transmit the gas flow.

In some embodiments, the second layer defines a third aperture, and the second aperture and the third aperture are arranged in a grid pattern in the second layer.

In some embodiments, the second layer defines a plurality of apertures, including the second aperture and the third aperture, and the grid pattern is an n×m matrix of the plurality of apertures.

In some embodiments, the first layer defines a third aperture having a third shape different than a first shape of the first aperture.

In some embodiments, the first gas comprises a first gas type and the second gas comprises a second gas type different from the first gas type.

In some embodiments, the first gas has a lower relative humidity than the second gas.

According to some embodiments, a method includes supplying a gas flow into a housing disposed within a transfer chamber of an interface module for transferring a semiconductor wafer. The method includes passing the gas flow through a first layer in the housing, wherein the first layer defines a plurality of first apertures. The method includes passing the gas flow through a second layer in the housing after passing the gas flow through the first layer, wherein the second layer defines a plurality of polygonal second apertures to create, from the gas flow within the housing, a laminar air curtain exiting the housing.

In some embodiments, the method includes retaining the first layer within the housing below at least one gas nozzle to define a first gap between the at least one gas nozzle and the first layer. The method includes dispersing the gas flow within the first gap prior to passing the gas flow through the first layer and retaining the second layer within the housing below the first layer to define a second gap between the first layer and the second layer. The method includes dispersing the gas flow within the second gap prior to passing the gas flow through the second layer.

In some embodiments, the method includes passing the gas flow through a third layer disposed between the first layer and the second layer in the housing, wherein the third layer defines a plurality of third apertures and each of the first apertures has a diameter greater than a diameter of each of third apertures in the third layer.

In some embodiments, each of the plurality of first apertures has a corresponding first diameter less than or equal to a first maximum diameter, and each of the plurality of polygonal second apertures has a second diameter greater than the first maximum diameter.

In some embodiments, each of the plurality of first apertures has a corresponding first diameter less than or equal to a first maximum diameter, each of the plurality of polygonal second apertures has a first side with a first side length greater than the first maximum diameter, and each of the plurality of polygonal second apertures has a second side contiguous with the first side of an adjacent polygonal second aperture of the plurality of polygonal second apertures.

In some embodiments, the method includes constraining the laminar air curtain exiting the housing with a pair of extension portions extending from sides of the housing.

In some embodiments, a device includes a memory including processor executable instructions, and one or more processors operatively coupled to the memory that upon executing the processor executable instructions cause performance of operations. The operations include detecting, from a load port adjacent to an interface module, docking of a front opening unified pod (FOUP) onto the load port. The operations include controlling a gas supply to initiate a gas flow, wherein the gas flow creates a laminar air curtain across an opening defined in the interface module. The operations include controlling an interface door of the interface module adjacent to the FOUP to reveal the opening after control of the gas supply to initiate the gas flow. The operations include controlling an operating machine to transfer a semiconductor wafer through the opening between the FOUP and the interface module and controlling the interface door to cover the opening. The operations include controlling the gas supply to halt the gas flow after control of the interface door to cover the opening.

In some embodiments, the device causes performance of operations that include controlling a second interface door of the interface module to open to reveal a second opening defined in the interface module after control of the interface door to cover the opening. The operations include controlling the operating machine to transfer the semiconductor wafer through the second opening.

In some embodiments, the device causes performance of operations that include detecting, from a second load port adjacent to the interface module, docking of a second FOUP onto the second load port. The operations include controlling the gas supply to initiate a second gas flow, wherein the second gas flow creates a second laminar air curtain across the second opening. The operations include controlling a second interface door of the interface module adjacent to the second FOUP to reveal the second opening after control of the gas supply to initiate the second gas flow. The operations include controlling the operating machine to transfer the semiconductor wafer through the second opening and controlling the second interface door to cover the second opening. The operations include controlling the gas supply to halt the second gas flow after control of the second interface door to cover the second opening.

In some embodiments, the device causes performance of operations that include controlling the gas supply to initiate the gas flow, the operations include supplying the gas flow into a housing disposed within a transfer chamber of the interface module for transferring the semiconductor wafer. The operations include passing the gas flow through a first layer in the housing, the first layer defining a plurality of first apertures. The operations include passing the gas flow through a second layer in the housing after passing through the first layer, the second layer defining a plurality of polygonal second apertures to create, from the gas flow within the housing, the laminar air curtain.

In some embodiments, the device causes performance of operations that include controlling the gas supply to initiate the gas flow as a first gas flow of a first gas, and controlling a fan filter unit to initiate a second gas flow of a second gas within the interface module, wherein the first gas has a lower relative humidity than the second gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:

initiating a gas flow of a first gas parallel to a wall of an interface module to create an air curtain across an opening defined in the wall;

moving an interface door to reveal the opening, wherein the air curtain restrains a second gas within the interface module from passing through the opening;

transferring a semiconductor wafer through the opening;

moving the interface door to cover the opening; and halting the gas flow of the first gas after moving the interface door to cover the opening.

2. The method of claim 1, comprising:

initiating a gas flow of the second gas in a downward direction within the interface module, wherein the gas flow of the first gas has a first flow rate and the gas flow of the second gas has a second flow rate greater than the first flow rate.

3. The method of claim 1, comprising:

exhausting the first gas and the second gas from a lower portion of the interface module such that the air curtain is maintained in a downward direction within a transfer chamber of the interface module across the opening.

4. The method of claim 1, comprising:

supplying the gas flow of the first gas into a housing disposed within a transfer chamber of the interface module above the opening;

passing the gas flow of the first gas through a first layer in the housing, wherein the first layer defines a first aperture; and passing the gas flow of the first gas from the first layer through a second layer in the housing, wherein the second layer defines a second aperture having a second aperture size greater than a first size of the first aperture to constrain and transmit the gas flow.

5. The method of claim 4, wherein:

the second layer defines a third aperture, and the second aperture and the third aperture are arranged in a grid pattern in the second layer.

6. The method of claim 5, wherein:

the second layer defines a plurality of apertures, including the second aperture and the third aperture, and the grid pattern is an n×m matrix of the plurality of apertures.

7. The method of claim 4, wherein the first layer defines a third aperture having a third shape different than a first shape of the first aperture.

8. The method of claim 1, wherein the first gas comprises a first gas type and the second gas comprises a second gas type different from the first gas type.

9. The method of claim 1, wherein the first gas has a lower relative humidity than the second gas.

10. A method, comprising:

supplying a gas flow into a housing disposed within a transfer chamber of an interface module for transferring a semiconductor wafer;

passing the gas flow through a first layer in the housing, wherein the first layer defines a plurality of first apertures; and passing the gas flow through a second layer in the housing after passing the gas flow through the first layer, wherein the second layer defines a plurality of polygonal second apertures to create, from the gas flow within the housing, a laminar air curtain exiting the housing.

11. The method of claim 10, comprising:

retaining the first layer within the housing below at least one gas nozzle to define a first gap between the at least one gas nozzle and the first layer;

dispersing the gas flow within the first gap prior to passing the gas flow through the first layer;

retaining the second layer within the housing below the first layer to define a second gap between the first layer and the second layer; and dispersing the gas flow within the second gap prior to passing the gas flow through the second layer.

12. The method of claim 10, comprising:

passing the gas flow through a third layer disposed between the first layer and the second layer in the housing, wherein the third layer defines a plurality of third apertures and each of the plurality of first apertures has a diameter greater than a diameter of each of the plurality of third apertures in the third layer.

13. The method of claim 10, wherein:

each of the plurality of first apertures has a corresponding first diameter less than or equal to a first maximum diameter, and each of the plurality of polygonal second apertures has a second diameter greater than the first maximum diameter.

14. The method of claim 10, wherein:

each of the plurality of first apertures has a corresponding first diameter less than or equal to a first maximum diameter, each of the plurality of polygonal second apertures has a first side with a first side length greater than the first maximum diameter, and each of the plurality of polygonal second apertures has a second side contiguous with the first side of an adjacent polygonal second aperture of the plurality of polygonal second apertures.

15. The method of claim 10, comprising:

constraining the laminar air curtain exiting the housing with a pair of extension portions extending from sides of the housing.

16. A device, comprising:

a memory comprising processor executable instructions; and one or more processors operatively coupled to the memory that upon executing the processor executable instructions cause performance of operations comprising:

detecting, from a load port adjacent to an interface module, docking of a front opening unified pod (FOUP) onto the load port;

controlling a gas supply to initiate a gas flow, wherein the gas flow creates a laminar air curtain across an opening defined in the interface module;

controlling an interface door of the interface module adjacent to the FOUP to reveal the opening after control of the gas supply to initiate the gas flow;

controlling an operating machine to transfer a semiconductor wafer through the opening between the FOUP and the interface module;

controlling the interface door to cover the opening; and controlling the gas supply to halt the gas flow after control of the interface door to cover the opening.

17. The device of claim 16, wherein the operations comprise:

controlling a second interface door of the interface module to open to reveal a second opening defined in the interface module after control of the interface door to cover the opening; and controlling the operating machine to transfer the semiconductor wafer through the second opening.

18. The device of claim 17, wherein the operations comprise:

detecting, from a second load port adjacent to the interface module, docking of a second FOUP onto the second load port;

controlling the gas supply to initiate a second gas flow, wherein the second gas flow creates a second laminar air curtain across the second opening;

controlling the second interface door of the interface module adjacent to the second FOUP to reveal the second opening after control of the gas supply to initiate the second gas flow;

controlling the operating machine to transfer the semiconductor wafer through the second opening;

controlling the second interface door to cover the second opening; and controlling the gas supply to halt the second gas flow after control of the second interface door to cover the second opening.

19. The device of claim 16, wherein:

controlling the gas supply to initiate the gas flow, comprises:

supplying the gas flow into a housing disposed within a transfer chamber of the interface module for transferring the semiconductor wafer;

passing the gas flow through a first layer in the housing, the first layer defining a plurality of first apertures; and passing the gas flow through a second layer in the housing after passing through the first layer, the second layer defining a plurality of polygonal second apertures to create, from the gas flow within the housing, the laminar air curtain.

20. The device of claim 16, wherein the operations comprise:

controlling the gas supply to initiate the gas flow as a first gas flow of a first gas; and controlling a fan filter unit to initiate a second gas flow of a second gas within the interface module, wherein the first gas has a lower relative humidity than the second gas.

* * * * *